United States Patent

Unami

[19]

[11] Patent Number: 6,150,902
[45] Date of Patent: *Nov. 21, 2000

[54] ELECTRONIC COMPONENT, LADDER FILTER AND COMMUNICATION APPARATUS

[75] Inventor: Toshihiko Unami, Omihachiman, Japan

[73] Assignee: Murata Manufacturing Co, Ltd, Japan

[*] Notice: This patent is subject to a terminal disclaimer.

[21] Appl. No.: 09/161,971

[22] Filed: Sep. 28, 1998

[30] Foreign Application Priority Data

Oct. 1, 1997 [JP] Japan ................................. 9-286175
Sep. 1, 1998 [JP] Japan ................................. 10-247206

[51] Int. Cl.[7] ........................... H03H 9/58; H03H 9/60
[52] U.S. Cl. ........................ 333/189; 310/328; 310/345; 310/348; 310/366
[58] Field of Search ..................... 333/186–192; 310/322, 328, 345, 346, 348, 352, 358, 359, 366, 367

[56] References Cited

U.S. PATENT DOCUMENTS

| | | |
|---|---|---|
| 5,400,001 | 3/1995 | Asakawa et al. ................. 333/189 X |
| 5,604,393 | 2/1997 | Suzuki et al. ..................... 333/193 X |
| 5,825,262 | 10/1998 | Inoue et al. ...................... 333/189 |
| 5,892,416 | 4/1999 | Unami et al. ..................... 333/187 |
| 5,900,790 | 5/1999 | Unami et al. ..................... 333/187 |
| 5,912,600 | 6/1999 | Unami ............................... 333/187 |
| 5,912,601 | 6/1999 | Unami et al. ..................... 333/187 |
| 5,925,970 | 7/1999 | Unami et al. ..................... 310/328 |
| 5,925,971 | 7/1999 | Unami ............................... 310/328 |
| 5,925,974 | 7/1999 | Yamamoto et al. ............... 310/348 |
| 5,932,951 | 8/1999 | Unami ........................... 310/348 X |

*Primary Examiner*—Robert Pascal
*Assistant Examiner*—Barbara Summons
*Attorney, Agent, or Firm*—Keating & Bennett, LLP

[57] ABSTRACT

A ladder filter includes an insulation substrate and a plurality of pattern electrodes provided on one major surface of the insulation substrate. A piezoelectric resonator which is a first series resonator, a piezoelectric resonator which is a first parallel resonator, a piezoelectric resonator which is a second parallel resonator and a piezoelectric resonator which is a second series resonator are arranged on the substrate in this order. External electrodes of these piezoelectric resonators are respectively bonded to the lands via a conductive bonding agent and are connected to pattern electrodes, respectively.

20 Claims, 24 Drawing Sheets

FIG. 4
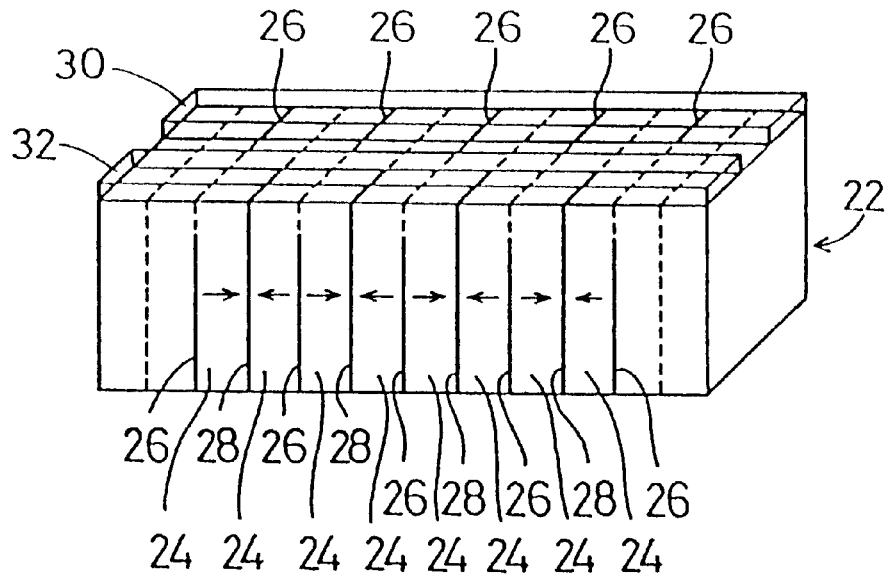
FIG. 5A
FIG. 5B
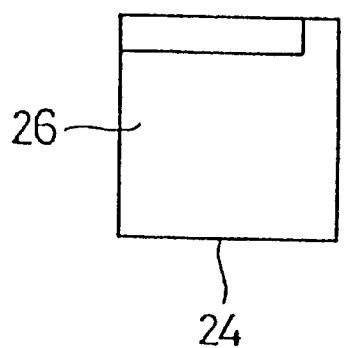
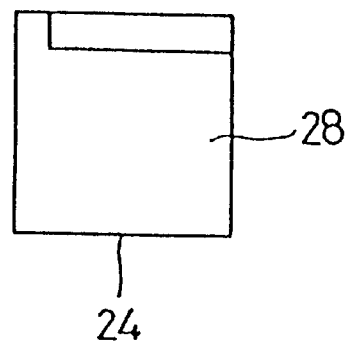

ELECTRONIC COMPONENT, LADDER FILTER AND COMMUNICATION APPARATUS

BACKGROUND OF THE INVENTION

1. Field of the Invention

The present invention relates to an electronic component, a ladder filter and a communication apparatus and, more particularly, to an electronic component, a ladder filter and a communication apparatus each including a plurality of piezoelectric resonators utilizing mechanical resonance of a piezoelectric body.

2. Description of the Related Art

FIG. 26 is a perspective view showing an example of a conventional piezoelectric resonator. A piezoelectric resonator 1 includes a piezoelectric substrate 2, for example, having a rectangular plate. The piezoelectric substrate 2 is polarized in a direction of thickness thereof. Electrodes 3 are provided on both major surfaces of the piezoelectric substrate 2. By inputting a signal between the electrodes 3, an electric field is applied in the direction of thickness of the piezoelectric substrate 2, causing the piezoelectric substrate 2 to vibrate along the length direction. Such a piezoelectric resonator 1 is an unstiffened type, in which the vibration direction is different from the electric-field direction and the polarization direction.

When a ladder filter is to be constructed by using such a piezoelectric resonator 1, for example, the construction shown in FIGS. 27 to 29 is used.

FIG. 27 is a plan diagrammatic view showing an example of the ladder filter. FIG. 28 is a front diagrammatic view thereof. A ladder filter 4 shown in FIGS. 27 and 28 includes an insulator substrate 5. Four pattern electrodes 6a, 6b, 6c and 6d are provided on the insulator substrate 5. One of the electrodes 3 of each of the two piezoelectric resonators 1a and 1b having the same construction as the above-described piezoelectric resonator 1 is connected to the pattern electrode 6b via a conductive bonding agent 7 made of a conductive resin or the like. Also, one of the electrodes 3 of each of the other two piezoelectric resonators 1c and 1d having the same construction as the above-described piezoelectric resonator 1 is connected to the pattern electrode 6c via the conductive bonding agent 7. Further, the other electrode 3 of the piezoelectric resonator 1a is connected to the pattern electrode 6a, the other electrode 3 of the piezoelectric resonator 1b is connected to the pattern electrode 6d, the other electrode 3 of the piezoelectric resonator 1c is connected to the pattern electrode 6b, and the other electrode 3 of the piezoelectric resonator 1d is connected to the pattern electrode 6d, each being connected via a conductive wire 8. A metal cap (not shown) is mounted on the insulator substrate 5 in such a manner as to cover the four pattern electrodes 6a to 6d. This ladder filter 4 has a ladder-type circuit shown in FIG. 29.

FIG. 30 is a plan diagrammatic view showing another example of a ladder filter, which provides a background for the present invention. FIG. 31 is a front diagrammatic view thereof. In a ladder filter 4 shown in FIGS. 30 and 31, each of the piezoelectric resonators 1a to 1d has a multilayer structure.

The features of the piezoelectric resonators 1a to 1d have been described by the applicant of the present invention in, for example, Japanese Patent Application No. 8-110475, which is still not published or laid open. A plurality of piezoelectric layers which constitute a base having a longitudinal direction and a plurality of electrodes are multilayered alternately, and the plurality of piezoelectric layers are polarized in the longitudinal direction of the base, generating a fundamental vibration of longitudinal vibration. Such a piezoelectric resonator of a multilayer structure is a stiffened type, in which the polarization direction, the electric-field direction, and the vibration direction of the piezoelectric layers are the same. In comparison with an unstiffened type piezoelectric resonator, there are advantages including small spurious emissions, and the difference $\Delta F$ between the resonance frequency and the anti-resonance frequency is large. Two external electrodes 3 and 3 are provided on one side of the piezoelectric resonators 1a to 1d. The external electrodes 3 of the piezoelectric resonator 1a are connected to the pattern electrodes 6a and 6b and the external electrodes 3 and 3 of the piezoelectric resonator 1b are connected to the pattern electrodes 6b and 6d, the external electrodes 3 and 3 of the piezoelectric resonator 1c are connected to the pattern electrodes 6b and 6c, and the external electrodes 3 and 3 of the piezoelectric resonator 1d are connected to the pattern electrodes 6c and 6d, each being connected via the conductive bonding agent 7.

In the ladder filter shown in FIGS. 27 and 28, however, a land portion for connecting a conductive wire in a pattern electrode is required on the insulating substrate, which prevents a reduction in size of the filter. Also, reliability is a problem because a conductive wire might be cut by an impact. Furthermore, handling of a conductive wire is complicated, the cost of facilities is high, and materials of components, such as electrodes and pattern electrodes of a piezoelectric resonator, for allowing connection of a conductive wire, are limited.

In the ladder filter shown in FIGS. 30 and 31, the piezoelectric resonator is bonded to the pattern electrode via a conductive bonding agent, but the conductive bonding agent spreads out beyond the bonded portion of the piezoelectric resonator. For this reason, when the spacing between these piezoelectric resonators is made as narrow as possible in order to reduce component size, the electrode of the adjacent piezoelectric resonator touches the portion where the conductive bonding agent is spread, causing a failure due to a short-circuit, making a reduction in size difficult. For this reason, the spacing between the two piezoelectric resonators 1b and 1c in the center of the substrate must be a very large distance which prevents any decrease in size.

SUMMARY OF THE INVENTION

To overcome the problems described above, the preferred embodiments of the present invention provide an electronic component, a ladder filter, and a communication apparatus, each of which has a significantly reduced size and avoids problems with short circuits between pattern electrodes.

Preferred embodiments of the present invention provide an electronic component including a substrate, a pattern electrode provided on the substrate and having a land portion, a plurality of electronic component elements provided on the substrate, each of the plurality of electronic component elements including a side surface having a longitudinal direction and two external electrodes provided on the side surface, the plurality of electronic component elements being arranged in order and electrically connected to each other in such a way that each pair of adjacent electronic component elements are connected to each other via a commonly shared one of the land portions and longitudinal directions of respective ones of the electronic component elements are aligned, at least one adjacent pair of the external electrodes each of which is provided on a different one of the electronic component elements disposed adjacent to each other are connected to a common land portion via a conductive bonding member.

In the above electronic component, each of the plurality of electronic component elements may be a piezoelectric resonator which is adapted to vibrate a longitudinal vibration mode.

Further, the piezoelectric resonator may include a base having a longitudinal direction, a plurality of internal electrodes substantially perpendicular to the longitudinal direction of the base and spaced apart along the longitudinal direction of the base, the base including a plurality of multilayered piezoelectric layers being polarized along the longitudinal direction of the base, the plurality of internal electrodes being provided on a surface that is substantially perpendicular to the longitudinal direction of the base on the piezoelectric layers, and the two external electrodes being provided on the surface of the base and connected to the plurality of internal electrodes.

The preferred embodiments of the present invention also provide a ladder filter including the above-described electronic component.

In the above-described ladder filter, the plurality of electronic component elements may include three piezoelectric resonators, and more particularly, a first parallel resonator, a second parallel resonator and a first series resonator.

Further, in the above-described ladder filter, the plurality of electronic component elements may include four piezoelectric resonators, and more particularly, a first parallel resonator, a second parallel resonator, a first series resonator and a second series resonator, and the four piezoelectric resonators may be arranged in the order of the first series resonator, the first parallel resonator, the second parallel resonator and the second series resonator.

Further, in the above-described ladder filter, the plurality of electronic component elements may include four piezoelectric resonators, and more particularly, a first parallel resonator, a second parallel resonator, a first series resonator and a second series resonator, and the four piezoelectric resonators are arranged in the order of the first series resonator, the second series resonator, the second parallel resonator and the first parallel resonator.

Further, in the above-described ladder filter, the plurality of electronic component elements may include five piezoelectric resonators, and more particularly, a first parallel resonator, a second parallel resonator, a third parallel resonator, a first series resonator and a second series resonator.

Further, in the above-described ladder filter, the plurality of electronic component elements may include seven piezoelectric resonators, and more particularly, a first parallel resonator, a second parallel resonator, a third parallel resonator, a fourth parallel resonator, a first series resonator, a second series resonator and a third series resonator.

The preferred embodiments of the present invention also provide a communication apparatus having a band-pass filter, in which the ladder filter according to the preferred embodiments describe above is used as the band-pass filter.

According to preferred embodiments of the present invention, since an external electrode of an electronic component element is connected to an external electrode on a substrate via a conductive bonding member, a conductive wire is not required, and a significant reduction in component size is possible.

Also, according to preferred embodiments of the present invention, one external electrode of each of two adjacent electronic component elements is connected to one land portion of the pattern electrode, insulation between these external electrodes need not be performed, and the adjacent electronic component elements can be positioned very close to each other to thereby significantly reduce the size of the electronic component.

Furthermore, according to preferred embodiments of the present invention, since one external electrode of each of two adjacent electronic component elements is connected to one land portion of the pattern electrode, a simple electrode needs only be provided on a substrate, and a complex electrode is not required, thereby allowing the size of the device to be significantly reduced.

When a piezoelectric resonator is to be used as an electronic component element, the piezoelectric resonator may include: a base having a longitudinal direction, and a plurality of internal electrodes which are perpendicular to the longitudinal direction of the base and which are spaced apart along the longitudinal direction of the base, wherein the base includes a plurality of multilayered piezoelectric layers, the plurality of piezoelectric layers are polarized along the longitudinal direction of the base, the plurality of internal electrodes are provided on a surface perpendicular to the longitudinal direction of the base on the piezoelectric layers, and two external electrodes are provided on the surface of the base and connected to the plurality of internal electrodes so as to generate a longitudinal vibration. The polarization direction and the electric-field direction coincide with the vibration direction, and the effect of the stiffened type piezoelectric resonator is utilized. Therefore, in comparison with an unstiffened type piezoelectric resonator in which the vibration direction is different from the polarization direction and the electric-field direction, a larger electro-mechanical coupling coefficient is achieved thereby making it possible to increase the width of the selection of the difference $\Delta F$ between the resonance frequency and the anti-resonance frequency. Also, by using the piezoelectric longitudinal effect in the piezoelectric resonator, a vibration mode different that is from the fundamental vibration of a length mode, such as a width mode or a thickness mode, is not easily generated, causing spurious emissions to be small.

Other features and advantages of the present invention will become apparent from the following description of the invention which refers to the accompanying drawings.

BRIEF DESCRIPTION OF THE DRAWINGS

FIG. 4 is a diagrammatic view showing a piezoelectric resonator used in the ladder filter shown in FIG. 1.

FIGS. 5(a) and 5(b) are plan views showing internal electrodes used in the piezoelectric resonator shown in FIG. 4.

DETAILED DESCRIPTION OF PREFERRED EMBODIMENTS

Figure 1:
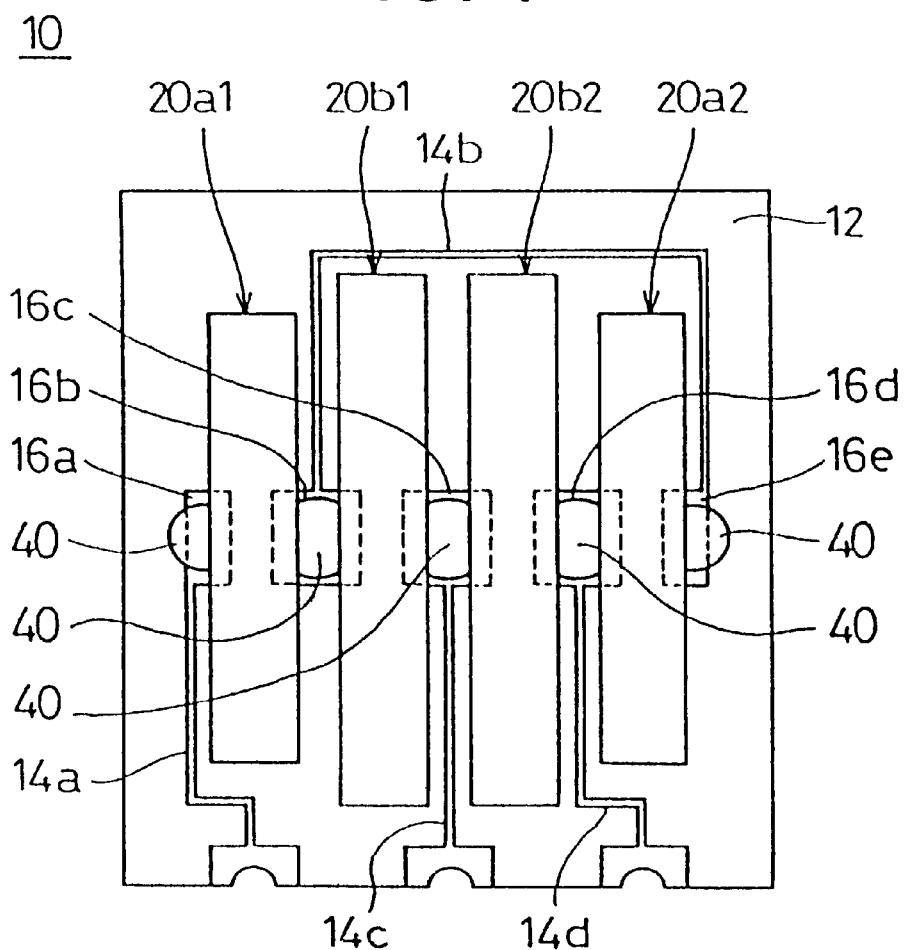
FIG. 1 is a plan diagrammatic view showing a preferred embodiment of a ladder filter according to the present invention.
Figure 2:
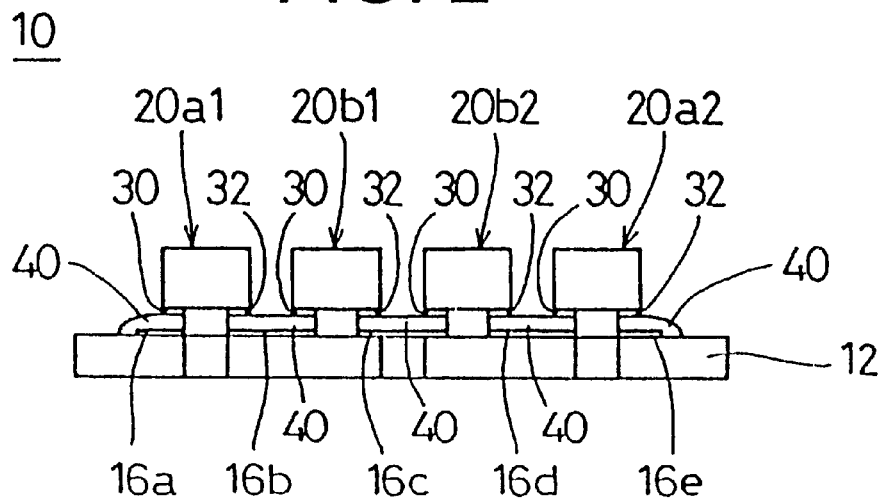
FIG. 2 is a front diagrammatic view of the ladder filter shown in FIG. 1.

Referring to FIGS. 1 to 5, a ladder filter 10 preferably includes an insulation substrate 12, for example, having a substantially rectangular plate shape. As the insulation substrate 12, a well-known insulation substrate, such as a glass epoxy substrate or an alumina substrate, is used.

Four pattern electrodes 14$a$, 14$b$, 14$c$ and 14$d$ are preferably provided on one major surface of the insulator substrate 12 and are spaced apart from each other by a desired distance.

Five lands (land portions) 16$a$, 16$b$, 16$c$, 16$d$ and 16$e$ are arranged in a row on the respective pattern electrodes 14$a$ to 14$d$. in this case, the lands 16$a$ to 16$d$ are provided at one end portion of the pattern electrodes 14$a$ to 14$d$, respectively, and the land 16$e$ is provided on the other end portion of the pattern electrode 14$b$.

Four piezoelectric resonators 20$a$1, 20$b$1, 20$b$2 and 20$a$2 are arranged in this order on the lands 16$a$ to 16$e$ of the pattern electrodes 14$a$ to 14$d$. In this case, the two piezoelectric resonators 20$a$1 and 20$a$2 are used as series resonators and preferably have the same construction, and the other two piezoelectric resonators 20$b$1 and 20$b$2 are used as parallel resonators and preferably have the same construction. The capacitance of the piezoelectric resonators 20$b$1 and 20$b$2 is preferably greater than the capacitance of the piezoelectric resonators 20$a$1 and 20$a$2. The piezoelectric resonators 20$a$1 and 20$a$2, and the piezoelectric resonators 20$b$1 and 20$b$2 preferably have similar construction although their lengths are different. For example, the lengths of the piezoelectric resonators 20$a$1 and 20$a$2 are about 4.2 mm and the lengths of the piezoelectric resonators 20$b$1 and 20$b$2 are about 4.6 mm, depending upon the difference in the capacitance. In view of the fact that the resonators 20$a$1, 20$a$2, 20$b$1, 20$b$2 have similar construction, the structure of only one piezoelectric resonator 20$a$1 will be described in detail.

The piezoelectric resonator 20$a$1, as shown in FIG. 4, includes, for example, a substantially rectangular-parallelepiped base 22 of about 4.2 mm×1 mm×1 mm. The base 22 includes piezoelectric layers 24, for example, 12 layers, which are arranged in a multilayered configuration. The piezoelectric layers 24 are preferably formed from, for example, a piezoelectric ceramic. The piezoelectric layers 24 each preferably have the same dimensions. The intermediate piezoelectric layers 24, for example the middle eight layers, are polarized along the length direction of the base 22 so that the polarization directions of the adjacent piezoelectric layers 24 are opposite to each other, as indicated by the arrows of FIG. 4.

A first internal electrode 26 and a second internal electrode 28 are provided alternately on a major surface perpendicular to the length direction of the base 22 in the intermediate piezoelectric layers 24 to be polarized. Therefore, the internal electrodes 26 and 28 are arranged perpendicular to the length direction of the base 22 and spaced apart along the length direction of the base 22. Also, as shown in FIG. 5($a$), the internal electrodes 26 are arranged on the major surface of the piezoelectric layers 24 such that a portion is excluded from an intermediate portion of the upper side to the edge portion of the layers 24. As shown in FIG. 5($b$), the other internal electrode 28 is arranged on the major surface of the piezoelectric layers 24 such that a portion is excluded from the intermediate portion of the upper side to an edge of the layers 24. Therefore, at one side surface at upper surface of the base 22, one internal electrode 26 is provided so that it is not exposed at one end portion extending to an intermediate portion, but is exposed at the other end portion. Also, the other internal electrode 28, at one side surface of the upper side of the base 22, is provided so that it is exposed at one end portion at the intermediate portion, and is not exposed at the other end portion at the intermediate portion.

External electrodes 30 and 32 are arranged in two rows on one side surface of the upper surface of the base 22. In this case, one external electrode 30 is connected to one internal electrode 26 and the other external electrode 32 is connected to the other internal electrode 28.

In this piezoelectric resonator 20a1, the external electrodes 30 and 32 are used as input and output electrodes. As a result of supplying a signal to the external electrodes 30 and 32, an electric field is applied between the adjacent internal electrodes 26 and 28. Therefore, the intermediate piezoelectric layers 24, excluding the piezoelectric layers 24 at the two ends of the base 22, become piezoelectrically active. In this case, since mutually opposing voltages are applied to the piezoelectric layers 24 of the base 22, which are polarized in mutually opposite directions, the piezoelectric layers 24 expand or contract as an integral unit in the same direction. That is, an alternate electric-field along the length direction of the base 22 is applied to the individual piezoelectric layers 24 by the internal electrodes 26 and 28 connected to the external electrodes 30 and 32, causing the individual piezoelectric layers 24 to generate a driving force for expansion and shrinkage of the piezoelectric resonator 20a1 as a whole, a fundamental vibration of longitudinal vibration with the approximate central portion along the length direction of the base 22 being a node is generated. In the two end portions along the length direction of the base 22, since these portions are not polarized and no electric field is applied because no electrodes are located there, these portions are piezoelectrically inactive.

In this piezoelectric resonator 20a1, the polarization direction of the piezoelectric layers 24, the electric-field direction by the input signal, and the vibration direction of the piezoelectric layers 24 are the same. That is, this piezoelectric resonator 2a1 is a stiffened type piezoelectric resonator. This piezoelectric resonator 20a1 has an electro-mechanical coupling coefficient greater than an unstiffened type piezoelectric resonator in which the polarization direction, the electric-field direction, and the vibration direction are different. For this reason, in this piezoelectric resonator 20a1, the difference ΔF between the resonance frequency and the anti-resonance frequency is larger than an unstiffened type piezoelectric resonator. Therefore, this piezoelectric resonator 20a1 achieves a characteristic such that the band width is larger than that of an unstiffened type piezoelectric resonator.

Figure 6:
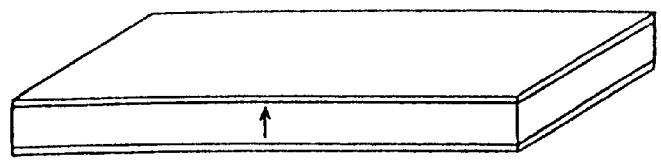
FIG. 6 is a perspective view showing a comparative example of an unstiffened type piezoelectric resonator which generates a longitudinal vibration.
Figure 7:
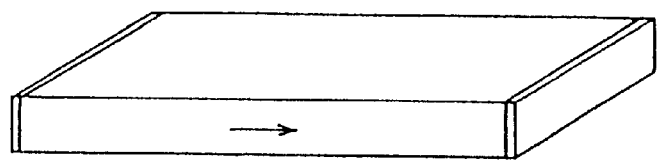
FIG. 7 is a perspective view showing a stiffened type piezoelectric resonator which generates a longitudinal vibration.
Figure 8:
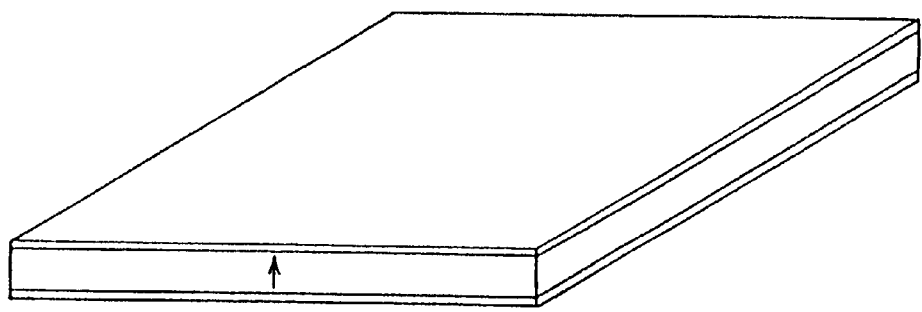
FIG. 8 is a perspective view showing a comparative example of an unstiffened type piezoelectric resonator which generates an expansion vibration.

In order to measure the difference between the stiffened type and unstiffened type piezoelectric resonators, a piezoelectric resonator shown in FIGS. 6, 7, and 8 was manufactured. The piezoelectric resonator shown in FIG. 6 is such that electrodes are provided on both sides of the piezoelectric substrate of about 4.0 mm×1.0 mm×0.38 mm along the thickness direction. The piezoelectric substrate is polarized along the thickness direction, and by supplying a signal to the electrodes, a longitudinal vibration is excited. The piezoelectric resonator shown in FIG. 7 has the same dimensions as those of the piezoelectric resonator shown in FIG. 6, and such that electrodes are provided on both surfaces of the piezoelectric substrate along the length direction. The piezoelectric substrate is polarized along the length direction, and by supplying a signal to the electrodes, a longitudinal vibration is excited. Also, the piezoelectric resonator shown in FIG. 8 is such that electrodes are provided on both surfaces of the piezoelectric substrate of 4.7 mm×4.7 mm×0.38 mm along the thickness direction. The piezoelectric substrate is polarized along the thickness direction, and by supplying a signal to electrodes, expansion vibration is excited. That is, the piezoelectric resonator shown in FIGS. 6 and 8 is an unstiffened type resonator, and the piezoelectric resonator shown in FIG. 7 is a stiffened type.

The resonance frequency Fr and the electro-mechanical coupling coefficient K of the above-described resonators were measured, and the results are shown in Tables 1, 2, and 3. Table 1 shows the measurement results of the piezoelectric resonator shown in FIG. 6. Table 2 shows the measurement results of the piezoelectric resonator shown in FIG. 7. Table 3 shows the measurement results of the piezoelectric resonator shown in FIG. 8.

TABLE 1

|  | Longitudinal fundamental vibration | Longitudinal third-harmonic wave | Width mode vibration |
| --- | --- | --- | --- |
| Resonance frequency (MHZ) | 0.460 | 1.32 | 1.95 |
| Electro-mechanical coupling coefficient (%) | 18.9 | 3.9 | 25.2 |

TABLE 2

|  | Longitudinal fundamental vibration | Longitudinal third-harmonic wave | Width mode vibration |
| --- | --- | --- | --- |
| Resonance frequency (MHZ) | 0.455 | 1.44 | 1.96 |
| Electro-mechanical coupling coefficient (%) | 42.9 | 12.2 | 4.0 |

TABLE 3

|  | Longitudinal fundamental vibration | Longitudinal third-harmonic wave | Width mode vibration |
| --- | --- | --- | --- |
| Resonance frequency (MHZ) | 0.458 | 1.25 | 5.65 |
| Electro-mechanical coupling coefficient (%) | 35.0 | 11.5 | 23.3 |

As can be seen from these measurement results, the electro-mechanical coupling coefficient K of the stiffened type piezoelectric resonator is greater than the unstiffened type piezoelectric resonator, and therefore, the difference ΔF between the resonance frequency and the anti-resonance frequency is larger. Regarding the largest spurious emission of the stiffened type piezoelectric resonator, the electro-mechanical coupling coefficient K is 12.2% at a longitudinal third-harmonic wave. Moreover, the electro-mechanical coupling coefficient K in the width mode different from the fundamental vibration is small at 4.0%.

In contrast, in the unstiffened type piezoelectric resonator, the electro-mechanical coupling coefficient K in the width mode is great and has a value of 25.2%. In the unstiffened type piezoelectric resonator, the electro-mechanical coupling coefficient K in the thickness mode is great and has value of 23.3%. Therefore, it can be seen that the stiffened type piezoelectric resonator has spurious emissions that are smaller than the unstiffened type piezoelectric resonator.

Furthermore, in this piezoelectric resonator 20a1, for example, by adjusting the area where the internal electrodes 26 and 28 oppose each other, the number of piezoelectric layers 24 and the internal electrodes 26 and 28, and the dimensions along the length direction of the base 22 in the piezoelectric layers 24, the capacitance of the resonator can be adjusted. That is, if the area where the internal electrodes 26 and 28 oppose each other is increased, the number of piezoelectric layers 24 and the internal electrodes 26 and 28 is increased, or if the dimensions along the length direction of the base 22 in the piezoelectric layers 24 are reduced, it is possible to increase the capacitance of the resonator. If, conversely, the area where the internal electrodes 26 and 28 oppose each other is decreased, the number of piezoelectric layers 24 and the internal electrodes 26 and 28 is decreased, or the dimensions along the length direction of the base 22 in the piezoelectric layers 24 are enlarged, it is possible to decrease the capacitance of the resonator. Therefore, by adjusting the area where the internal electrodes 26 and 28 oppose each other, the number of piezoelectric layers 24 and the internal electrodes 26 and 28, or the dimensions along the length direction of the base 22 in the piezoelectric layers 24, the capacitance can be adjusted, and the degree of freedom of capacitance design is large. Therefore, when the piezoelectric resonator 20a1 is mounted on a circuit substrate or the like, it is easy to achieve impedance matching with an external circuit.

In this ladder filter 10, a longitudinal central portion of the external electrode 30 of the piezoelectric resonator 20a1, which is a first series resonator, is bonded to the land 16a of the pattern electrode 14a via a conductive bonding agent 40 made of, for example, a conductive resin, which functions as a conductive bonding member. As a result, the external electrode 30 of the piezoelectric resonator 20a1 is connected to the pattern electrode 14a.

The longitudinal central portion of the external electrode 32 of the piezoelectric resonator 20a1, and the longitudinal central portion of the external electrode 30 of the piezoelectric resonator 20b1, which is a first parallel resonator, are bonded to the land 16b of the pattern electrode 14b via the conductive bonding agent 40. As a result, the external electrode 32 of the piezoelectric resonator 20a1 and the external electrode 30 of the piezoelectric resonator 20b1 are connected to the pattern electrode 14b.

Furthermore, the longitudinal central portion of the external electrode 32 of the piezoelectric resonator 20b1 and the longitudinal central portion of the external electrode 30 of the piezoelectric resonator 20b2, which is a second parallel resonator, are bonded to the land 16c of the pattern electrode 14c via the conductive bonding agent 40. As a result, the external electrode 32 of the piezoelectric resonator 20b1 and the external electrode 30 of the piezoelectric resonator 20b2 are connected to the pattern electrode 14c.

The longitudinal central portion of the external electrode 32 of the piezoelectric resonator 20b2 and the longitudinal central portion of the external electrode 30 of the piezoelectric resonator 20a2, which is a second series resonator, are bonded to the land 16d of the pattern electrode 14d via the conductive bonding agent 40. As a result, the external electrode 32 of the piezoelectric resonator 20b2 and the external electrode 30 of the piezoelectric resonator 20a2 are connected to the pattern electrode 14d.

Furthermore, the longitudinal central portion of the external electrode 32 of the piezoelectric resonator 20a2 is bonded to the land 16e of the pattern electrode 14b via the conductive bonding agent 40. As a result, the external electrode 32 of the piezoelectric resonator 20a2 is connected to the pattern electrode 14b.

Figure 3:
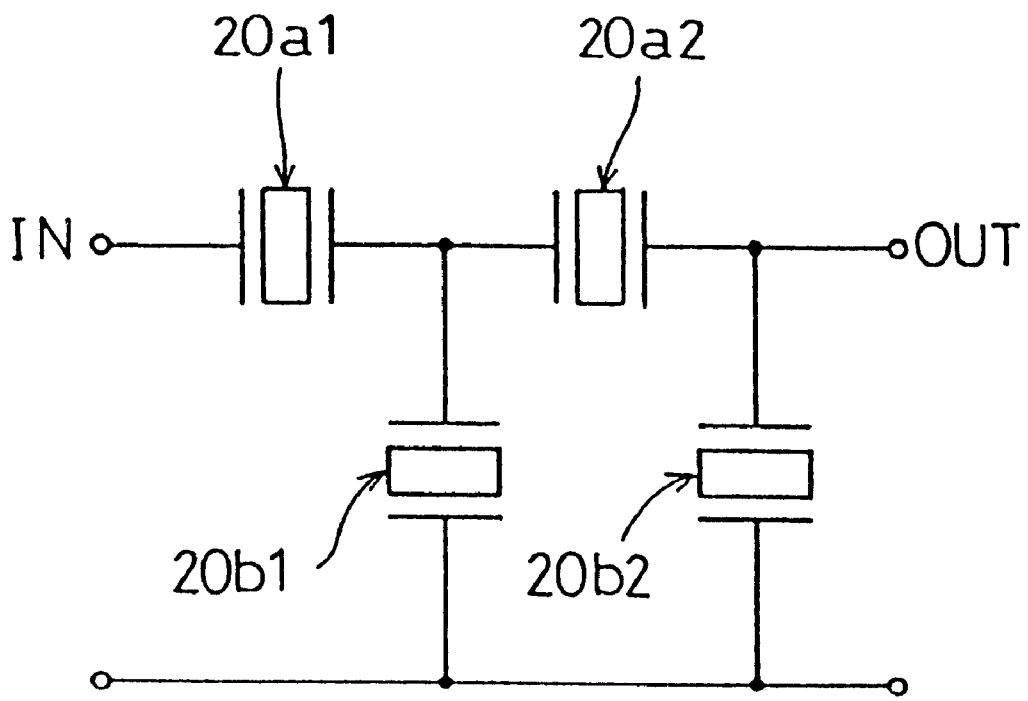
FIG. 3 is a circuit diagram of the ladder filter shown in FIG. 1.

Therefore, this ladder filter 10 includes a ladder-type circuit shown in FIG. 3. That is, in this ladder filter 10, the pattern electrode 14a is used as an input terminal, the pattern electrode 14d is used as an output terminal, and the pattern electrode 14c is used as a ground terminal.

In this ladder filter 10, a metal cap (not shown) is mounted onto the insulating substrate 12 in such a manner as to cover the piezoelectric resonators 20a1, 20a2, 20b1 and 20b2. In this case, to prevent the metal cap from electrically conducting with the pattern electrodes 14a to 14d, an insulating resin is applied on the insulator substrate 12 and the pattern electrodes 14a to 14d.

In this ladder filter 10, since the external electrodes 30 and 32 of the piezoelectric resonators 20a1, 20a2, 20b1 and 20b2 are connected to the pattern electrodes 14a to 14d on the insulator substrate 12 via the conductive bonding agent 40, a conductive wire is not required, and a significant reduction in size is possible.

In this ladder filter 10, since one external electrode of each of two adjacent piezoelectric resonators is connected to one pattern electrode, insulation is not required between the external electrodes, and the adjacent piezoelectric resonators can be positioned much closer to each other, thereby allowing a significant reduction in size.

Furthermore, in this ladder filter 10, since one external electrode of each of two adjacent piezoelectric resonators is connected to one pattern electrode, a simple pattern electrode need only be provided on an insulating substrate, and a complex pattern electrode is not required, thereby reducing the size of the filter.

In this ladder filter 10, since the piezoelectric resonator is supported via the conductive bonding agent located near the respective nodes and in a raised, floating state spaced from the insulation substrate, the vibration of the piezoelectric resonator is not hindered or damped.

Furthermore, this ladder filter 10, as described above, includes a piezoelectric resonator which has small spurious emissions such that the width of the selection of the difference ΔF between the resonance frequency and the anti-resonance frequency is large.

The amount of attenuation of the ladder filter depends upon the capacitance ratio of the series resonator relative to the parallel resonator. In this ladder filter 10, by varying the area where the internal electrodes 26 and 28 of the piezoelectric resonator oppose each other, the number of piezoelectric layers 24 and internal electrodes 26 and 28, and the dimensions along the length direction of the base 22 in the piezoelectric layers 24, the capacitance can be adjusted. Therefore, by adjusting the capacitance of the piezoelectric resonator, it is possible to realize a ladder filter having a larger attenuation with a smaller number of resonators in comparison with a case in which an unstiffened type piezoelectric resonator is used. Also, since the width of the selection of the ΔF of the piezoelectric resonator can be increased more than that of the unstiffened type piezoelectric resonator, a ladder filter with a wider pass band width can be realized.

Figure 9:
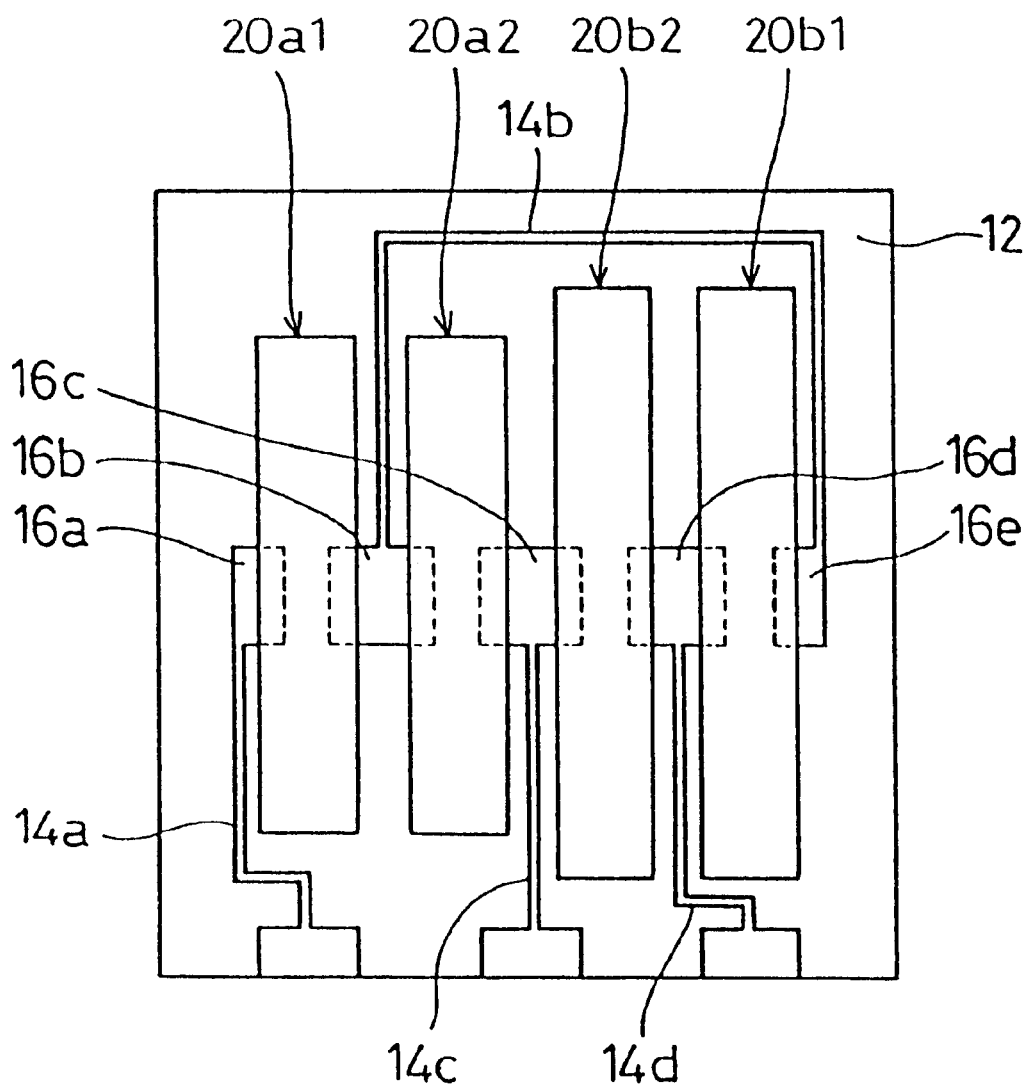
FIG. 9 is a plan diagrammatic view showing another preferred embodiment of a ladder filter according to the present invention.

FIG. 9 is a plan diagrammatic view showing another example of a ladder filter according to preferred embodiments of the present invention. The ladder filter shown in FIG. 9 differs from the ladder filter shown in FIG. 1 in only the arrangement of the piezoelectric resonator 20b1, which is a first parallel resonator, and the piezoelectric resonator 20a2, which is a second series resonator.

That is, in the ladder filter shown in FIG. 9, in comparison with the ladder filter shown in FIG. 1, the external electrodes 30 and 32 of the piezoelectric resonator 20a2, which is a second series resonator, are bonded to the lands 16b and 16c, respectively, via a conductive bonding agent, and connected to the pattern electrodes 14b and 14c, respectively. The external electrodes 30 and 32 of the piezoelectric resonator 20b1, which is a first parallel resonator, are bonded to the lands 16d and 16 e, respectively, via a conductive bonding agent, and connected to the pattern electrodes 14d and 14b, respectively. The conductive bonding agent is not shown in FIG. 9.

Therefore, the ladder filter 10 shown in FIG. 9 includes a ladder-type circuit shown in FIG. 3. In the ladder filter 10 shown in FIG. 9, the pattern electrode 14a is used as an input terminal, the pattern electrode 14c is used as an output terminal, and the pattern electrode 14d is used as a ground terminal.

The ladder filter shown in FIG. 9 also achieves advantages similar to those achieved by the ladder filter shown in FIG. 1.

Figure 10:
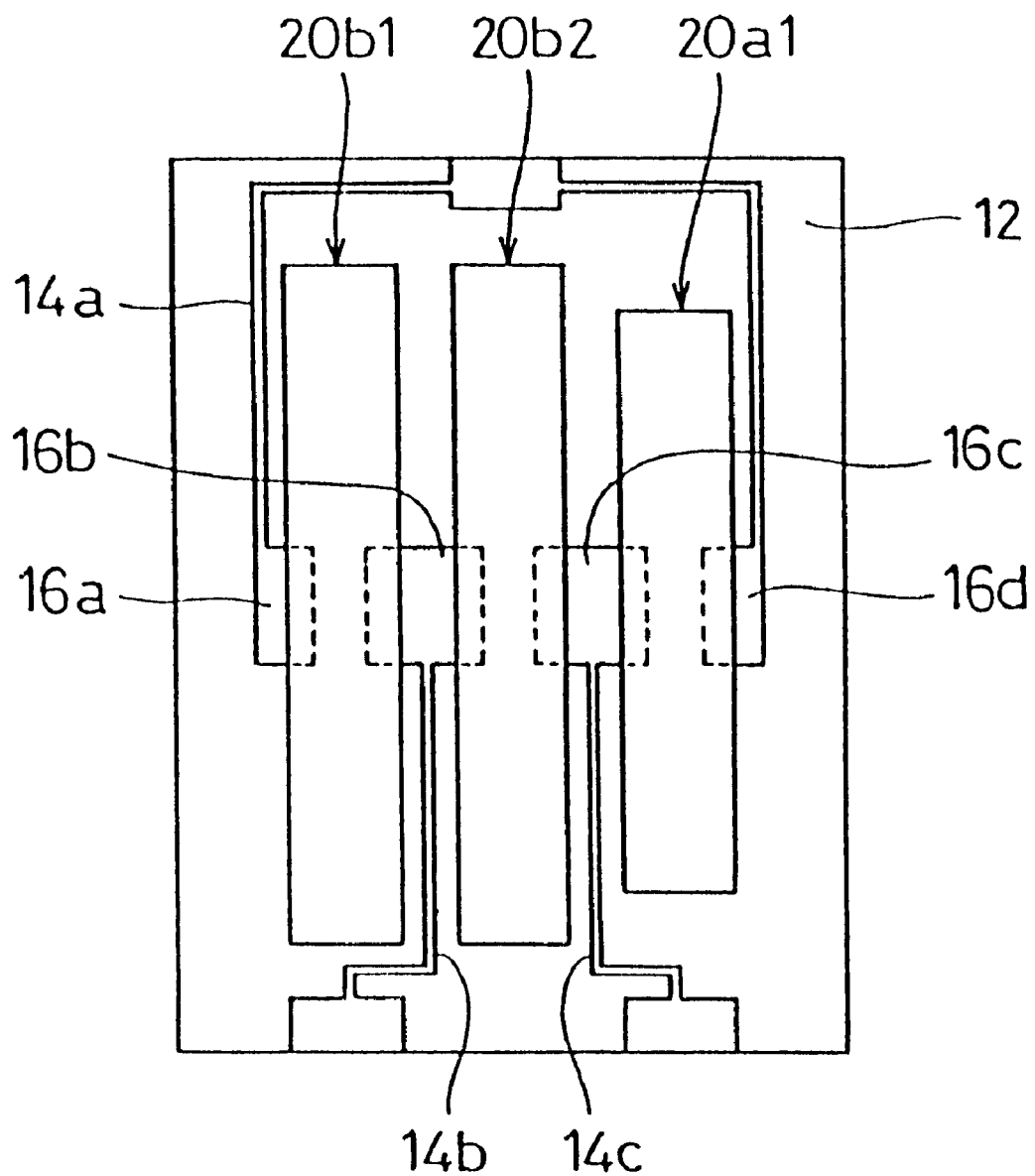
FIG. 10 is a plan diagrammatic view showing still another preferred embodiment of a ladder filter according to the present invention.
Figure 11:
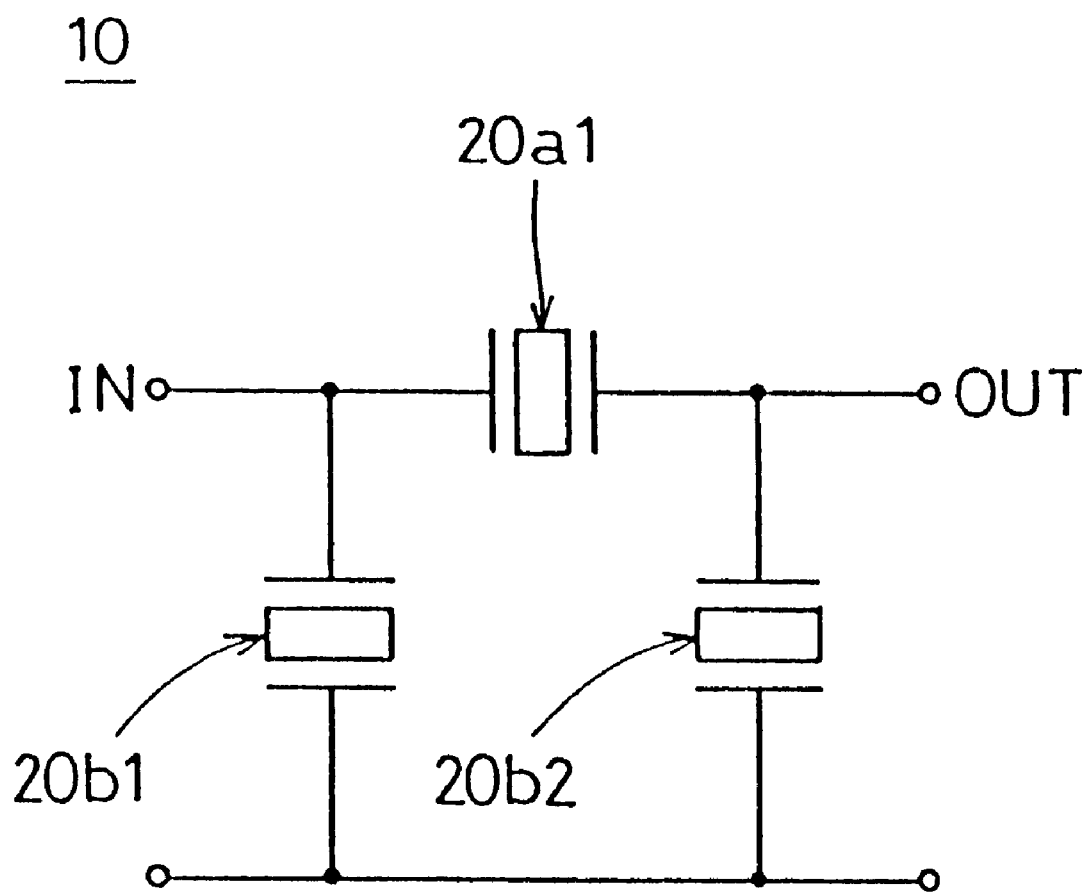
FIG. 11 is a circuit diagram of the ladder filter shown in FIG. 10.

FIG. 10 is a plan diagrammatic view showing still another example of a ladder filter according to a preferred embodiment of the present invention. FIG. 11 is a circuit diagram of the ladder filter. The ladder filter 10 shown in FIG. 10 includes an insulation substrate 12, for example, having a substantially rectangular plate shape.

Three pattern electrodes 14a, 14b and 14c are arranged spaced from each other on one major surface of the insulation substrate 12.

Four lands 16a, 16b, 16c and 16d are arranged spaced from each other and in a row on the pattern electrodes 14a to 14c. In this case, the lands 16a and 16d are provided at both end portions of the pattern electrode 14a, respectively, and the lands 16b and 16c are provided at the end portions of the pattern electrodes 14b and 14c, respectively.

The two external electrodes of the piezoelectric resonator 20b1, which is a first parallel resonator, are connected to the lands 16a and 16b, the two external electrodes of the piezoelectric resonator 20b2, which is a second parallel resonator, are connected to the lands 16b and 16c, and the two external electrodes of the piezoelectric resonator 20a1, which is a series parallel resonator, are connected to the lands 16c and 16d, each being bonded via a conductive bonding agent. As a result, the external electrodes are connected to the pattern electrodes 14a to 14c. Therefore, the ladder filter 10 shown in FIG. 10 includes a ladder-type circuit shown in FIG. 11. In this case, the pattern electrode 14a is used as an input terminal, the pattern electrode 14c is used as an output terminal, and the pattern electrode 14b is used as a ground terminal.

Figure 12:
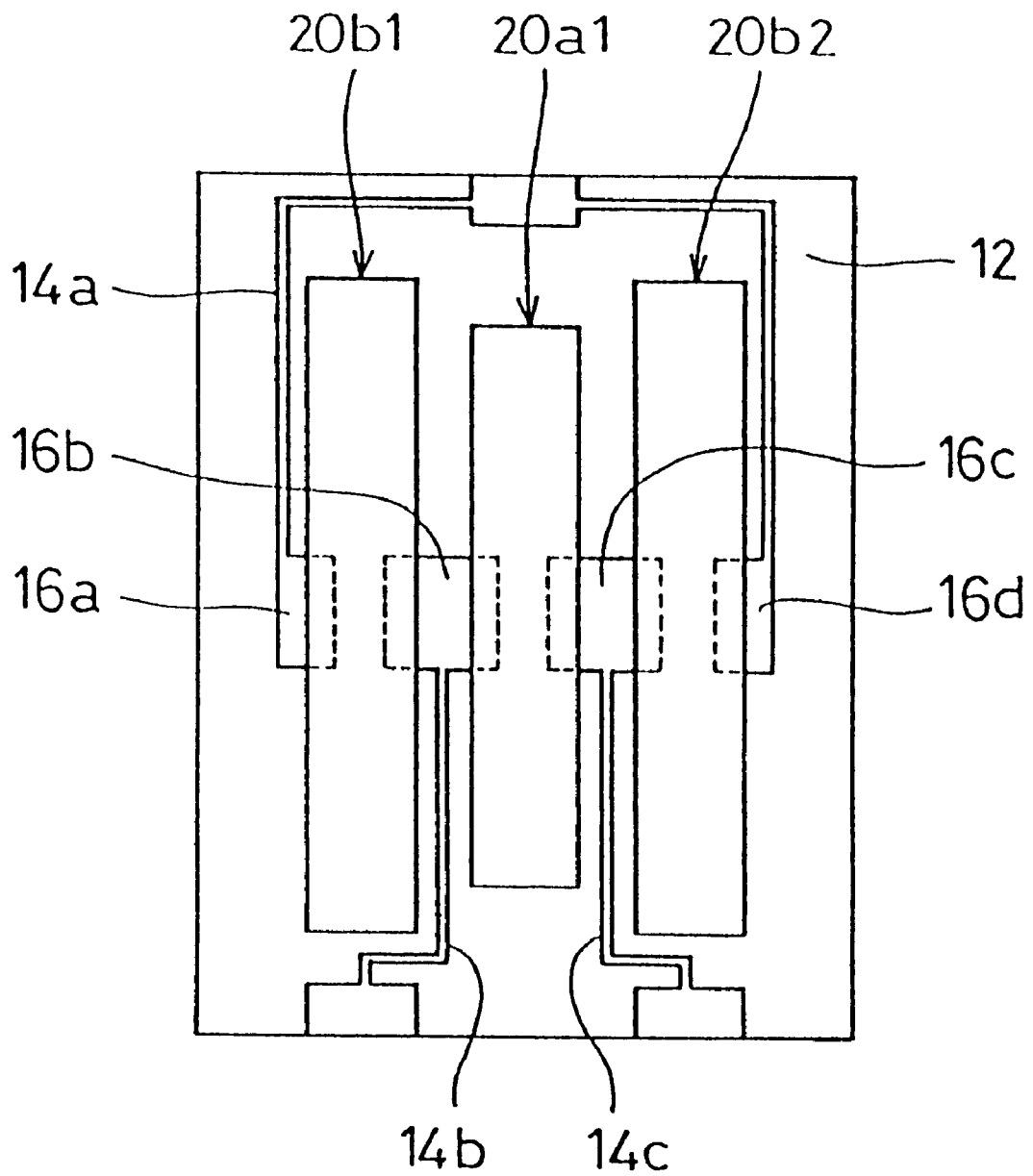
FIG. 12 is a plan diagrammatic view showing still another preferred embodiment of a ladder filter according to the present invention.

FIG. 12 is a plan diagrammatic view showing still another example of a ladder filter according to a preferred embodiment of the present invention. The ladder filter shown in FIG. 12 differs from the ladder filter shown in FIG. 10 only in the arrangement of the piezoelectric resonator 20b2, which is a second parallel resonator, and the piezoelectric resonator 20a1, which is a first series resonator. The ladder filter 10 shown in FIG. 12 also includes a ladder-type circuit shown in FIG. 11. In the ladder filter 10 shown in FIG. 12, the pattern electrode 14b is used as an input terminal, the pattern electrode 14c is used as an output terminal, and the pattern electrode 14a is used as a ground terminal.

Figure 13:
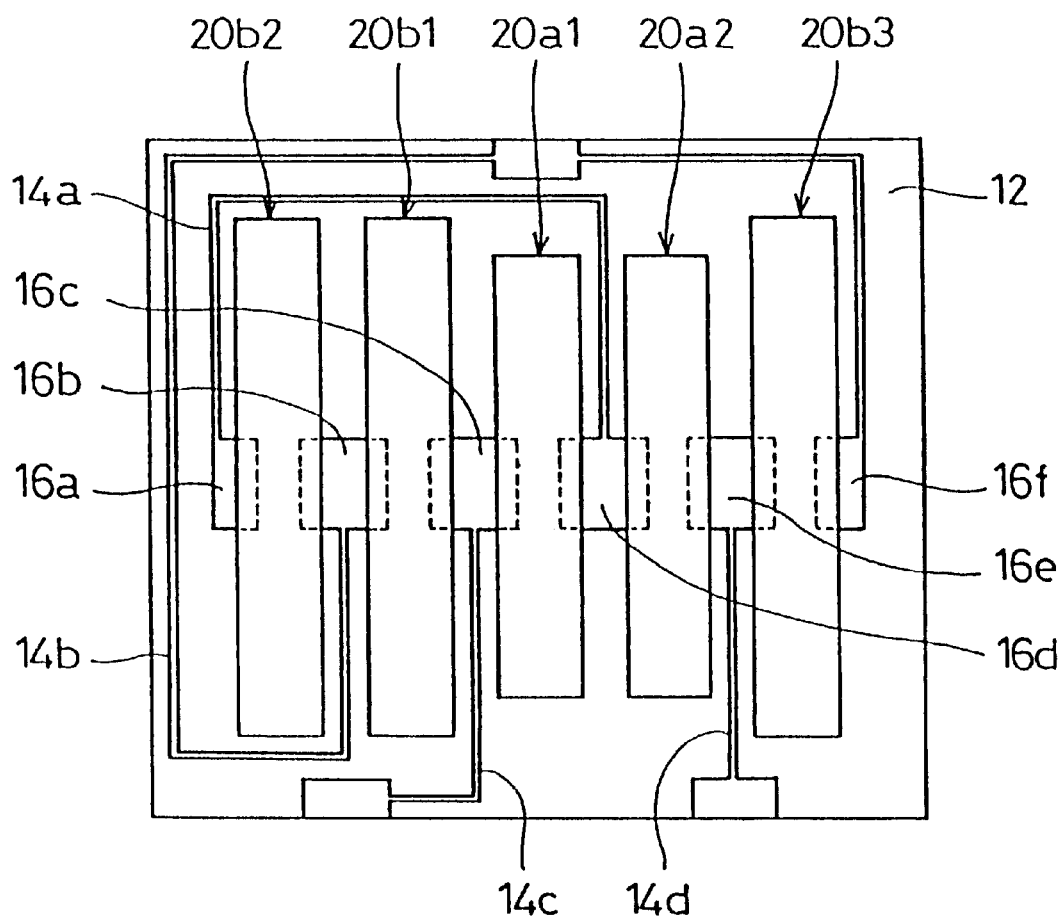
FIG. 13 is a plan diagrammatic view showing still another preferred embodiment of a ladder filter according to the present invention.
Figure 14:
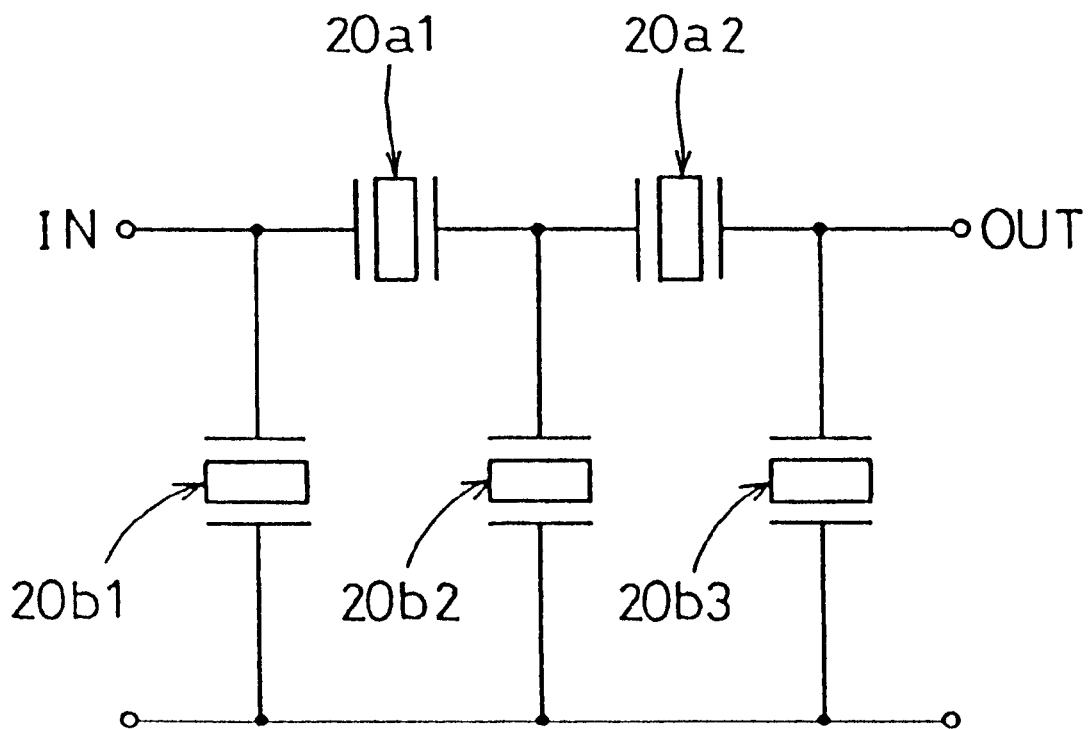
FIG. 14 is a circuit diagram of the ladder filter shown in FIG. 13.

FIG. 13 is a plan diagrammatic view showing still another example of a ladder filter according to a preferred embodiment of the present invention. FIG. 14 is a circuit diagram of the ladder filter shown in FIG. 13. The ladder filter 10 shown in FIG. 13 includes an insulator substrate 12, for example, having a substantially rectangular plate shape, with four pattern electrodes 14a, 14b, 14c and 14d and six lands 16a, 16b, 16c, 16d, 16e and 16f disposed on one major surface of the insulator substrate 12. The six lands 16a to 16f are arranged in a row and spaced from each other and located at the end portions of the pattern electrodes 14a to 14d. The two external electrodes of the piezoelectric resonator 20b2, which is a second parallel resonator, are connected to the lands 16a and 16b, the two external electrodes of the piezoelectric resonator 20b1, which is a first parallel resonator, are connected to the lands 16b and 16c, the two external electrodes of the piezoelectric resonator 20a1, which is a first series resonator, are connected to the lands 16c and 16d, the two external electrodes of the piezoelectric resonator 20a2, which is a second series resonator, are connected to the lands 16d and 16e, and the two external electrodes of the piezoelectric resonator 20b3, which is a third parallel resonator, are connected to the lands 16e and 16f, each being bonded via a conductive bonding agent. As a result, the external electrodes are connected to the pattern electrodes 14a to 14d. Therefore, the ladder filter 10 shown in FIG. 13 includes a ladder-type circuit shown in FIG. 14. The pattern electrode 14c is used as an input terminal, the pattern electrode 14d is used as an output terminal, and the pattern electrode 14b is used as a ground terminal.

Figure 15:
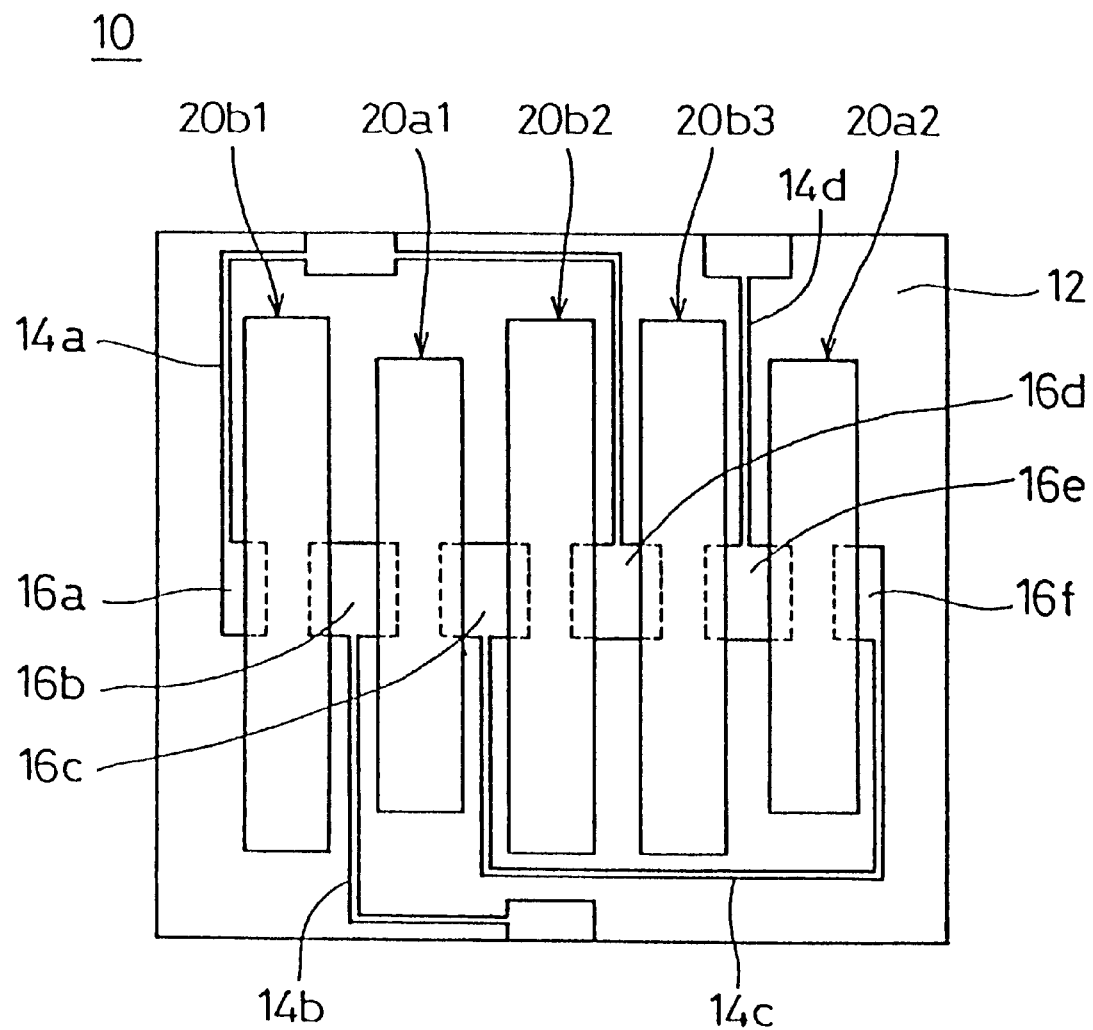
FIG. 15 is a plan diagrammatic view showing still another preferred embodiment of a ladder filter according to the present invention.

FIG. 15 is a plan diagrammatic view showing still another example of a ladder filter according to a preferred embodiment of the present invention. In the ladder filter shown in FIG. 15, in comparison with the ladder filter shown in FIG. 13, the piezoelectric resonator 20b1, which is a first parallel resonator, the piezoelectric resonator 20a1, which is a first series resonator, the piezoelectric resonator 20b2, which is a second parallel resonator, the piezoelectric resonator 20b3, which is a third parallel resonator, and the piezoelectric resonator 20a2, which is a second series resonator, are arranged in this order. In order to construct the ladder-type circuit shown in FIG. 14, four pattern electrodes 14a to 14d and the six lands 16a to 16f are provided on one major surface of the insulation substrate 12, and the external electrodes of the five piezoelectric resonators 20b1, 20a1, 20b2, 20b3 and 20a2 are bonded to the six lands 16a to 16f via a conductive bonding agent. In the ladder filter 10 shown in FIG. 15, the pattern electrode 14b is used as an input terminal, the pattern electrode 14d is used as an output terminal, and the pattern electrode 14a is used as a ground terminal.

Figure 16:
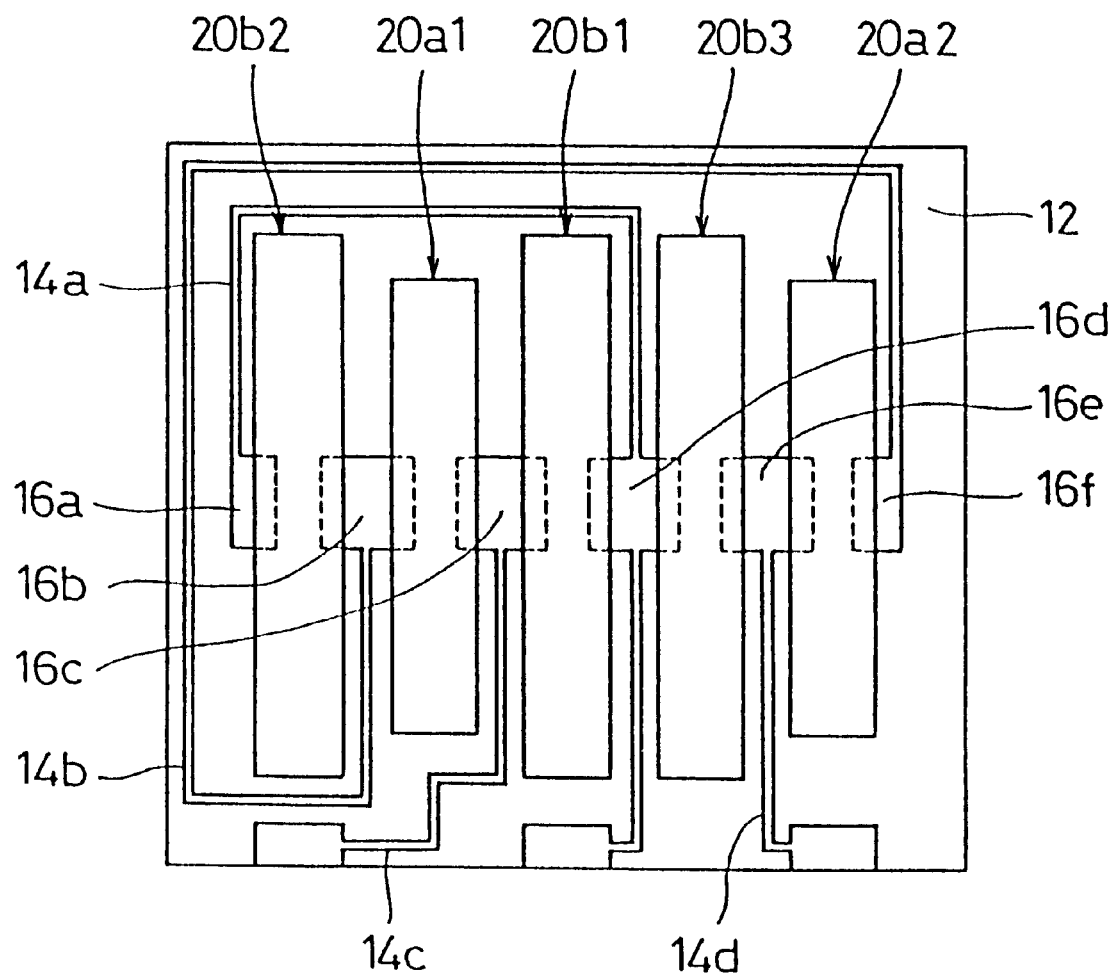
FIG. 16 is a plan diagrammatic view showing still another preferred embodiment of a ladder filter according to the present invention.

FIG. 16 is a plan diagrammatic view showing still another example of a ladder filter according to a preferred embodiment of the present invention. In the ladder filter shown in FIG. 16, in comparison with the ladder filter shown in FIG. 13, the piezoelectric resonator 20b2, which is a second parallel resonator, the piezoelectric resonator 20a1, which is a first series resonator, the piezoelectric resonator 20b1, which is a first parallel resonator, the piezoelectric resonator 20b3, which is a third parallel resonator, and the piezoelectric resonator 20a2, which is a second series resonator, are arranged in this order. Also, in order to obtain the ladder-type circuit shown in FIG. 14, the four pattern electrodes 14a to 14d and the six lands 16a to 16f are provided on one major surface of the insulator substrate 12, and the external electrodes of the five piezoelectric resonators 20b2, 20a1, 20b1, 20b3, and 20a2 are bonded to the six lands 16a to 16f via a conductive bonding agent. In the ladder filter 10 shown in FIG. 16, the pattern electrode 14c is used as an input terminal, the pattern electrode 14d is used as an output terminal, and the pattern electrode 14a is used as a ground terminal.

Figure 17:
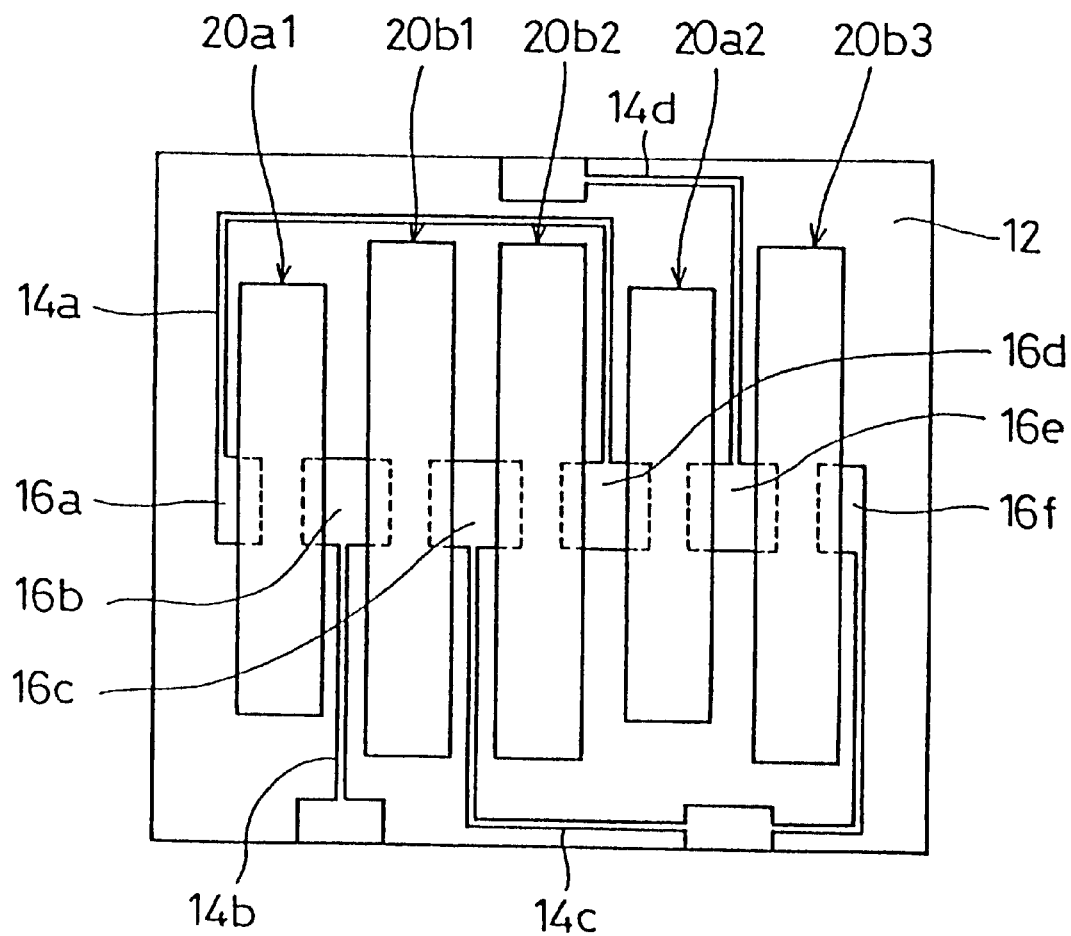
FIG. 17 is a plan diagrammatic view showing still another preferred embodiment of a ladder filter according to the present invention.

FIG. 17 is a plan diagrammatic view showing still another example of a ladder filter according to a preferred embodiment of the present invention. In the ladder filter shown in FIG. 17, in comparison with the ladder filter shown in FIG. 13, the piezoelectric resonator 20a1, which is a first series resonator, the piezoelectric resonator 20b1, which is a first parallel resonator, the piezoelectric resonator 20b2, which is a second parallel resonator, the piezoelectric resonator 20a2, which is a second series resonator, and the piezoelectric resonator 20b3, which is a third parallel resonator, are arranged in this order. Also, in order to construct the ladder-type circuit shown in FIG. 14, the four pattern electrodes 14a to 14d and the six lands 16a to 16f are provided on one major surface of the insulator substrate 12, the external electrodes of the five piezoelectric resonators 20a1, 20b1, 20b2, 20a2 and 20b3 are bonded to the six lands 16a to 16f via a conductive bonding agent. In the ladder filter 10 shown in FIG. 17, the pattern electrode 14b is used as an input terminal, the pattern electrode 14d is used as an output terminal, and the pattern electrode 14c is used as a ground terminal.

Figure 18:
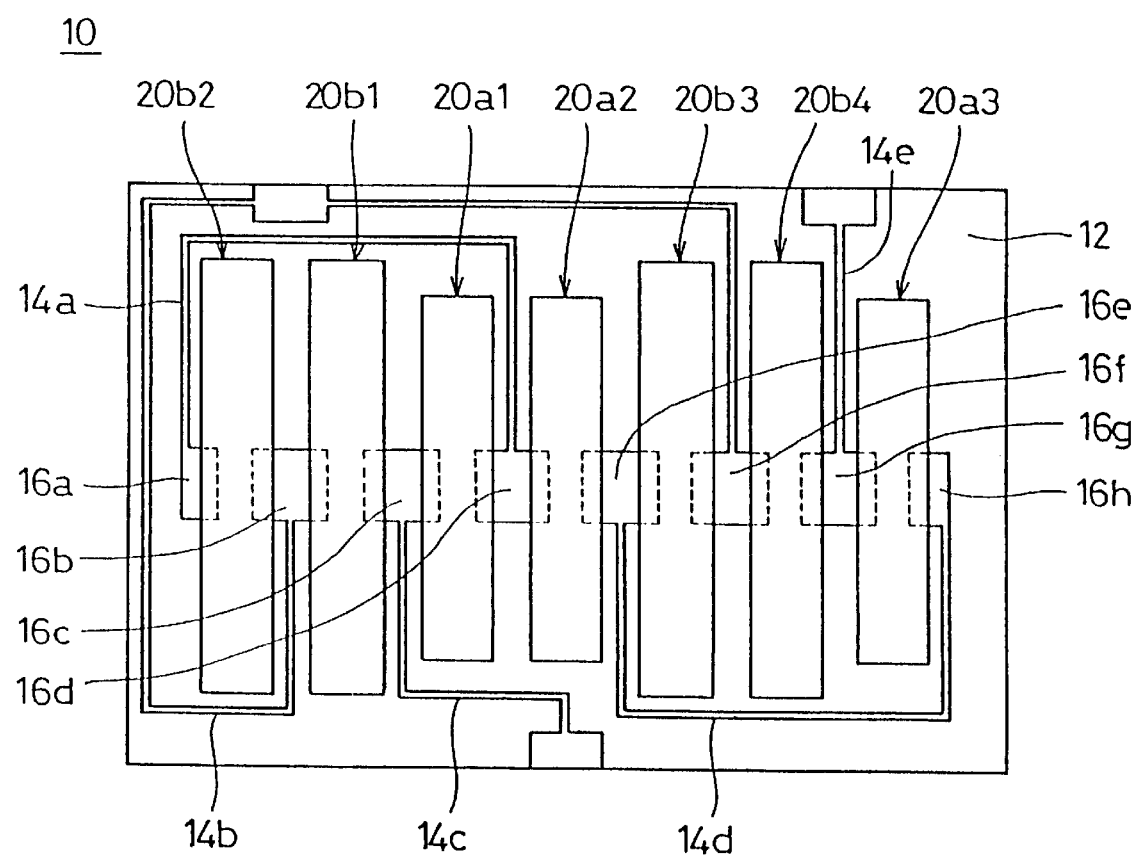
FIG. 18 is a plan diagrammatic view showing still another preferred embodiment of a ladder filter according to the present invention.
Figure 19:
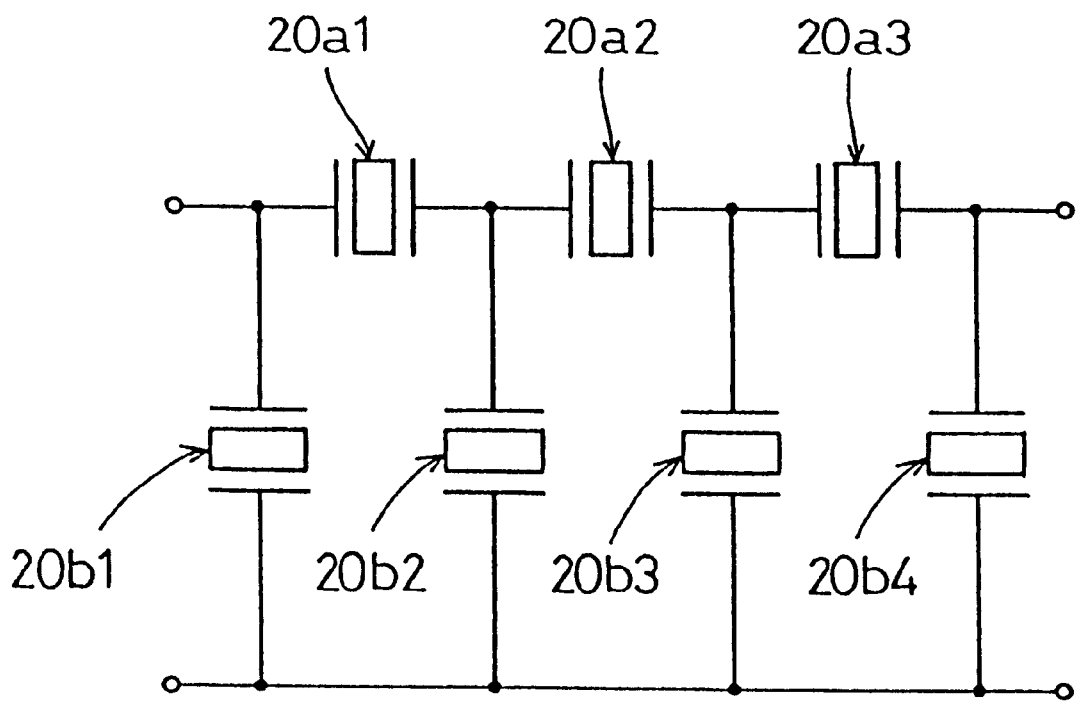
FIG. 19 is a circuit diagram of the ladder filter shown in FIG. 18.

FIG. 18 is a plan diagrammatic view showing still another example of a ladder filter according to a preferred embodiment of the present invention. FIG. 19 is a circuit diagram of the ladder filter shown in FIG. 18. The ladder filter 10 shown in FIG. 18 includes an insulation substrate 12, for example, having a substantially rectangular plate shape, with five pattern electrodes 14a, 14b, 14c, 14d, and 14e and eight lands 16a, 16b, 16c, 16d, 16e, 16f, 16g, and 16h provided on one major surface of the insulation substrate 12. The eight lands 16a to 16h are spaced from each other and arranged in one row at the end portions of the pattern electrodes 14a to 14e. The two external electrodes of the piezoelectric resonator 20b2, which is a second parallel resonator, are connected to the lands 16a and 16b, the two external electrodes of the piezoelectric resonator 20b1, which is a first parallel resonator, are connected to the lands 16b and 16c, the two external electrodes of the piezoelectric resonator 20a1, which is a first series resonator, are connected to the lands 16c and 16d, the two external electrodes of the piezoelectric resonator 20a2, which is a second series resonator, are connected to the lands 16d and 16e, the two external electrodes of the piezoelectric resonator 20b3, which is a third parallel resonator, are connected to the lands 16e and 16f, the two external electrodes of a piezoelectric resonator 20b4, which is a fourth parallel resonator, are connected to the lands 16f and 16g, and the two external electrodes of the piezoelectric resonator 20a3, which is a third series resonator, are connected to the lands 16g and 16h, each being bonded via a conductive bonding agent. As a result, the external electrodes are connected to the pattern electrodes 14a to 14e. Therefore, the ladder filter 10 shown in FIG. 18 includes a ladder-type circuit shown in FIG. 19. In this case, the pattern electrode 14c is used as an input terminal, the pattern electrode 14e is used as an output terminal, and the pattern electrode 14b is used as a ground terminal.

Figure 20:
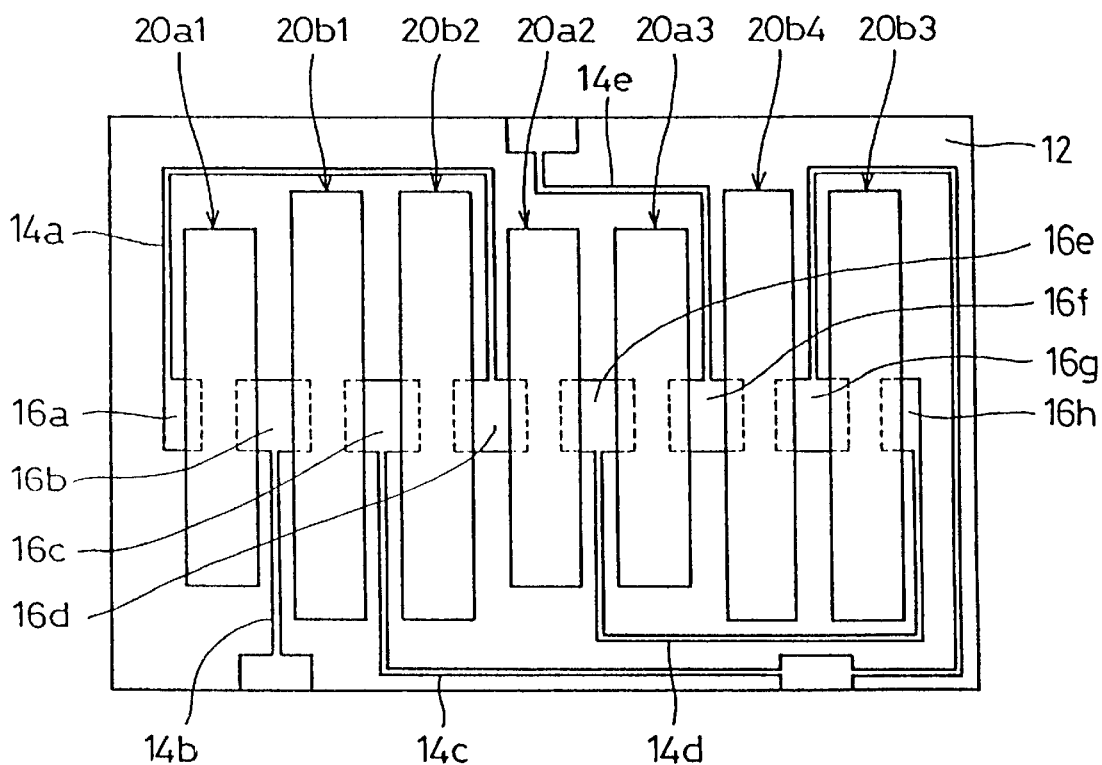
FIG. 20 is a plan diagrammatic view showing still another preferred embodiment of a ladder filter according to the present invention.

FIG. 20 is a plan diagrammatic view showing still another example of a ladder filter according to a preferred embodiment of the present invention. In the ladder filter shown in FIG. 20, in comparison with the ladder filter shown in FIG. 18, the piezoelectric resonator 20a1, which is a first series resonator, the piezoelectric resonator 20b1, which is a first parallel resonator, the piezoelectric resonator 20b2, which is a second parallel resonator, the piezoelectric resonator 20a2, which is a second series resonator, a piezoelectric resonator 20a3, which is a third series resonator, the piezoelectric resonator 20b4, which is a fourth parallel resonator, and the piezoelectric resonator 20b3, which is a third parallel resonator, are arranged in this order. Also, in order to construct the ladder-type circuit shown in FIG. 19, the five pattern electrodes 14a to 14e and the eight lands 16a to 16h are provided on one major surface of the insulator substrate 12, and the external electrodes of the seven piezoelectric resonators 20a1, 20b1, 20b2, 20a2, 20a3, 20b4 and 20b3 are bonded to the eight lands 16a to 16h via a conductive bonding agent. In the ladder filter 10 shown in FIG. 20, the pattern electrode 14b is used as an input terminal, the pattern electrode 14e is used as an output terminal, and the pattern electrode 14c is used as a ground terminal.

Figure 21:
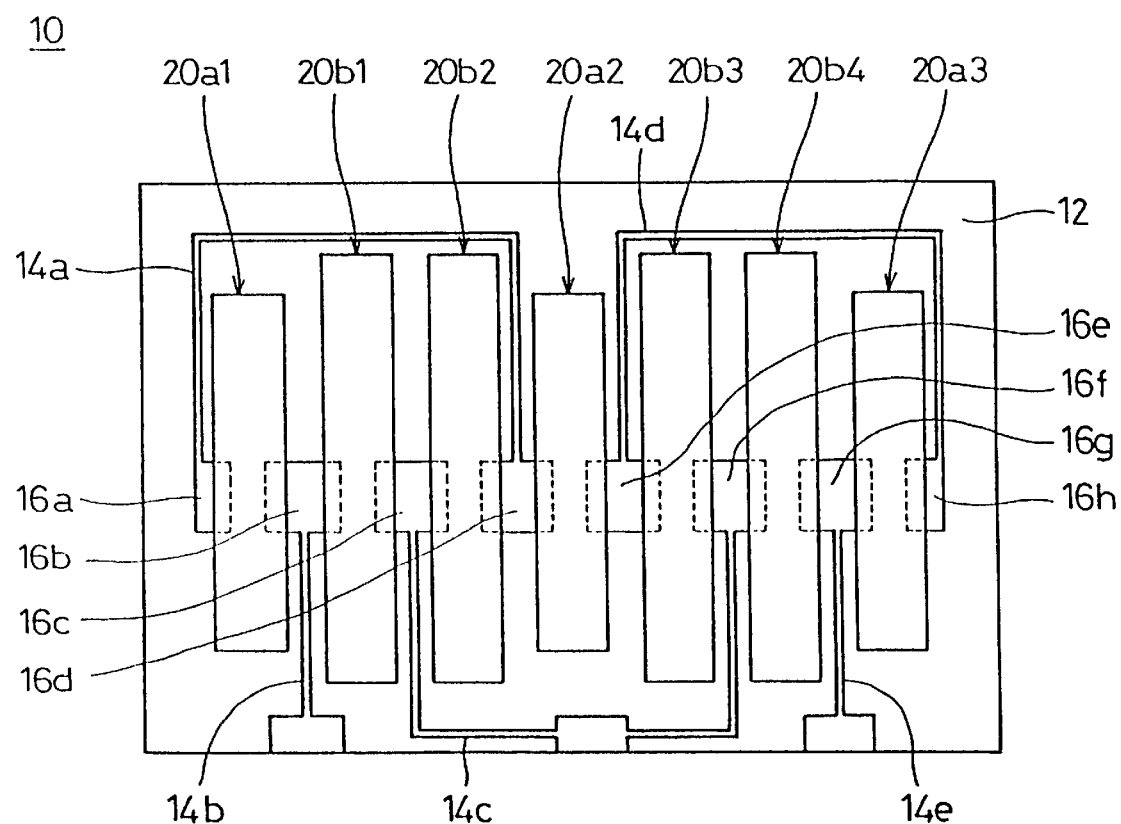
FIG. 21 is a plan diagrammatic view showing still another preferred embodiment of a ladder filter according to the present invention.

FIG. 21 is a plan diagrammatic view showing still another example of a ladder filter according to a preferred embodiment of the present invention. In the ladder filter shown in FIG. 21, in comparison with the ladder filter shown in FIG. 18, the piezoelectric resonator 20a1, which is a first series resonator, the piezoelectric resonator 20b1, which is a first parallel resonator, the piezoelectric resonator 20b2, which is a second parallel resonator, the piezoelectric resonator 20a2, which is a second series resonator, the piezoelectric resonator 20b3, which is a third parallel resonator, the piezoelectric resonator 20b4, which is a fourth parallel resonator, and the piezoelectric resonator 20a3, which is a third series resonator, are arranged in this order. Also, in order to construct the ladder-type circuit shown in FIG. 19, the five pattern electrodes 14a to 14e and the eight lands 16a to 16h are provided on one major surface of the insulator substrate 12, and the external electrodes of the seven piezoelectric resonators 20a1, 20b1, 20b2, 20a2, 20b3, 20b4, and 20a3 are bonded to the eight lands 16a to 16h via a conductive bonding agent. In the ladder filter 10 shown in FIG. 21, the pattern electrode 14b is used as an input terminal, the pattern electrode 14e is used as an output terminal, and the pattern electrode 14c is used as a ground terminal.

Figure 22:
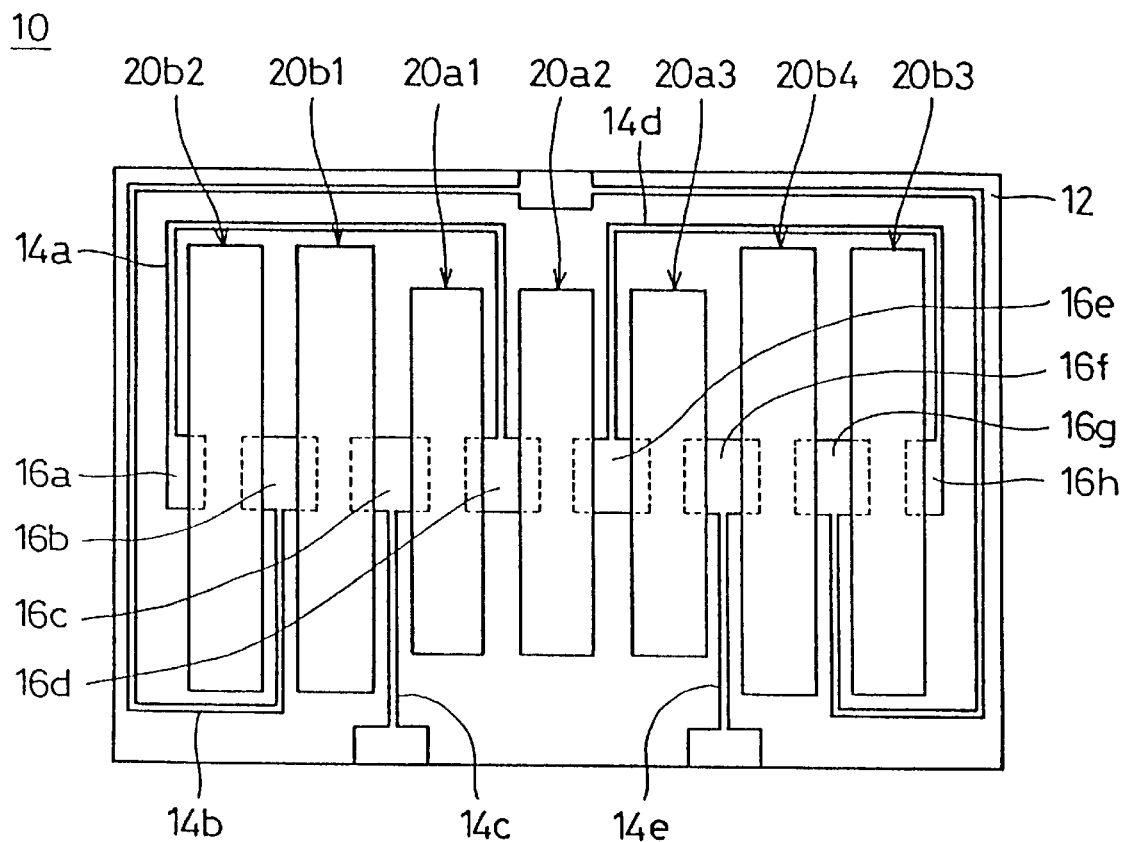
FIG. 22 is a plan diagrammatic view showing still another preferred embodiment of a ladder filter according to the present invention.

FIG. 22 is a plan diagrammatic view showing still another example of a ladder filter according to preferred embodiments of the present invention. In the ladder filter shown in FIG. 22, in comparison with the ladder filter shown in FIG. 18, the piezoelectric resonator 20b2, which is a second parallel resonator, the piezoelectric resonator 20b1, which is a first parallel resonator, the piezoelectric resonator 20a1, which is a first series resonator, the piezoelectric resonator 20a2, which is a second series resonator, the piezoelectric resonator 20a3, which is a third series resonator, the piezoelectric resonator 20b4, which is a fourth parallel resonator, and the piezoelectric resonator 20b3, which is a third parallel resonator, are arranged in this order. Also, in order that the ladder-type circuit shown in FIG. 19 is obtained, the five pattern electrodes 14a to 14e and the eight lands 16a to 16h are provided on one major surface of the insulator substrate 12, and the external electrodes of the seven piezoelectric resonators 20b2, 20b1, 20a1, 20a2, 20a3, 20b4 and 20b3 are bonded to the eight lands 16a to 16h via a conductive bonding agent. In the ladder filter 10 shown in FIG. 22, the pattern electrode 14c is used as an input terminal, the pattern electrode 14e is used as an output terminal, and the pattern electrode 14b is used as a ground terminal.

Also in each ladder filter shown in FIGS. 9 to 22, similar to the ladder filter shown in FIG. 1, a metal cap (not shown) is mounted onto the insulator substrate 12 in such a manner as to cover the piezoelectric resonator and other components disposed on the substrate.

In each ladder filter shown in FIGS. 10 to 22, in comparison with the ladder filter shown in FIG. 1 or 9, the number of piezoelectric resonators to be used is different, but, a plurality of piezoelectric resonators are arranged in an order in which each pair of adjacent resonators are connected to each other via a commonly shared land portion in a similar manner. Thus, the same advantages are achieved by each of the preferred embodiments of the present invention.

Figure 23:
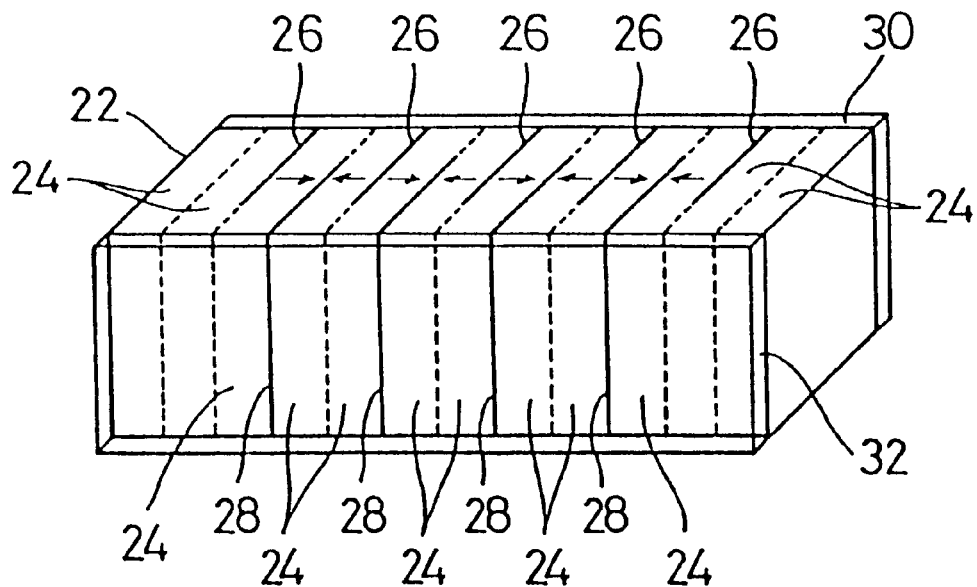
FIG. 23 is a diagrammatic view showing another preferred embodiment of a piezoelectric resonator for use in a ladder filter according to the present invention.
Figure 24A:
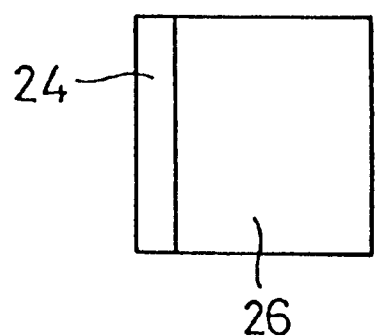
FIGS. 24($a$) and 24($b$) are plan views showing electrodes for use in the piezoelectric resonator shown in FIG. 23.
Figure 24B:
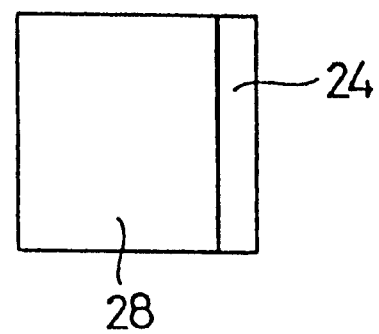

In each piezoelectric resonator used in each ladder filter 10, as shown in FIG. 4, the two external electrodes 30 and 32 are provided on one side surface of the base 22. In the present invention, however, the two external electrodes 30 and 32 of the piezoelectric resonator may be provided on two opposing side surfaces of the base 22, respectively, as shown in FIG. 23. In this case, as shown in FIG. 24(a), one electrode 26 is provided in a portion excluding one longitudinal-side portion on the major surface of the piezoelectric layers 24, and the other internal electrode 28, as shown in FIG. 24(b), is provided in a portion excluding the other longitudinal-side portion on the major surface of the piezoelectric layers 24. When the piezoelectric resonator shown in FIG. 23 is used, it is disposed so that one side surface where the external electrodes 30 and 32 are not provided opposes one major surface of the insulator substrate 12, and the two external electrodes 30 and 32 are connected to the respective pattern electrodes via a conductive bonding agent.

In each of the piezoelectric resonators described above, both end portions along the length direction of the base 22 are preferably piezoelectrically inactive. The piezoelectrically inactive portion may be provided at a portion other than both end portions along the length direction of the base 22, or may not be provided so that the whole base 22 along the length direction thereof is piezoelectrically active.

Figure 26:
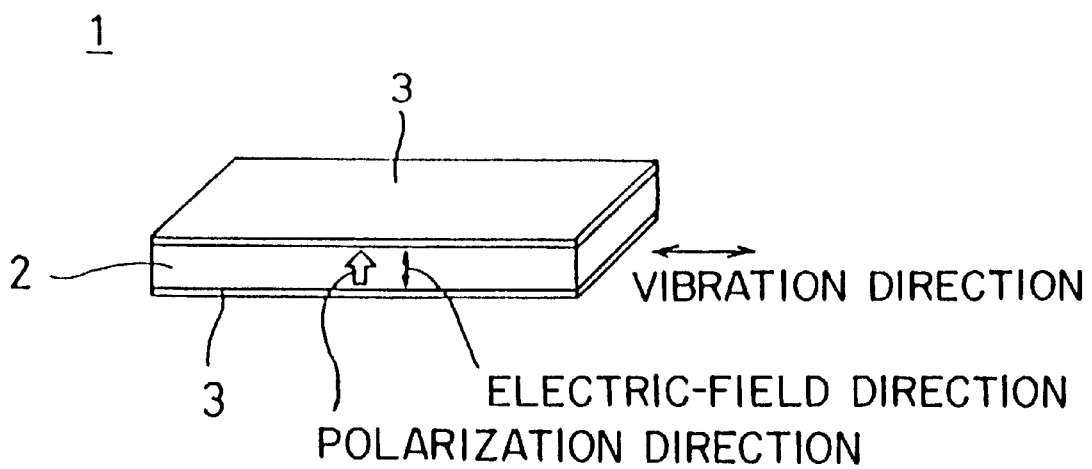
FIG. 26 is a perspective view showing an example of a conventional piezoelectric resonator.
Figure 27:
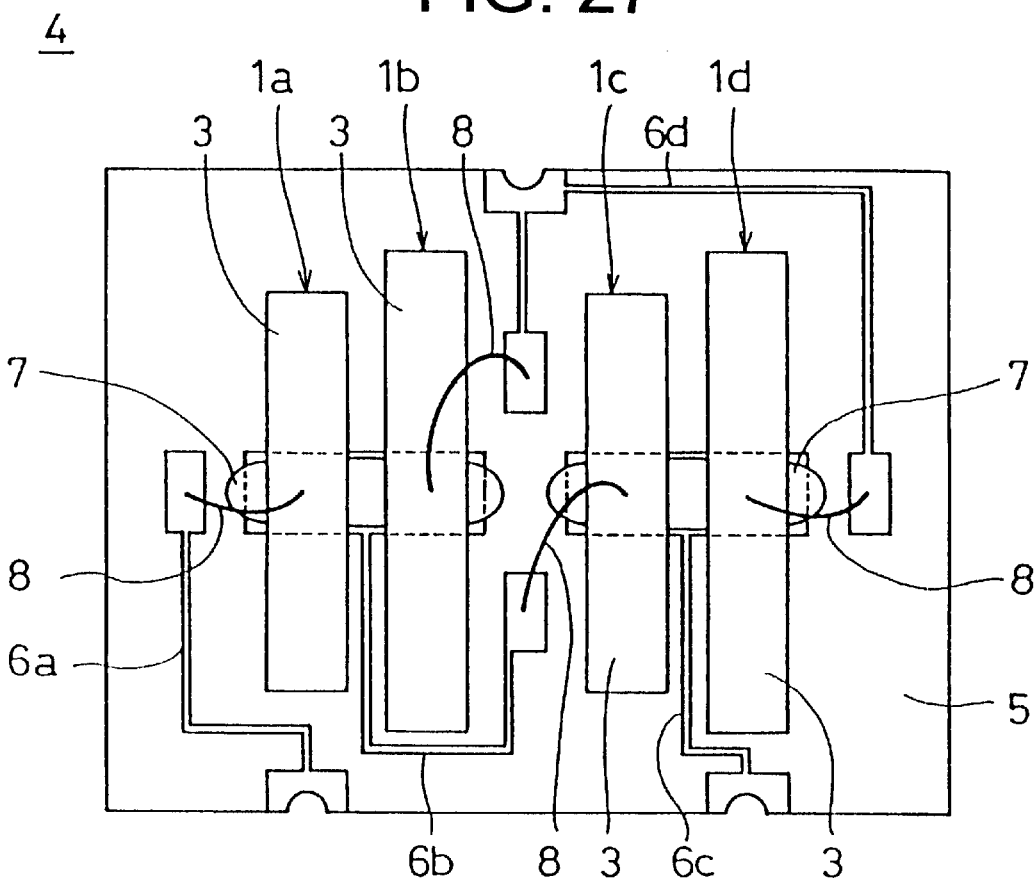
FIG. 27 is a plan diagrammatic view showing an example of a ladder filter which provides a background for comparison to preferred embodiments of the present invention.
Figure 28:
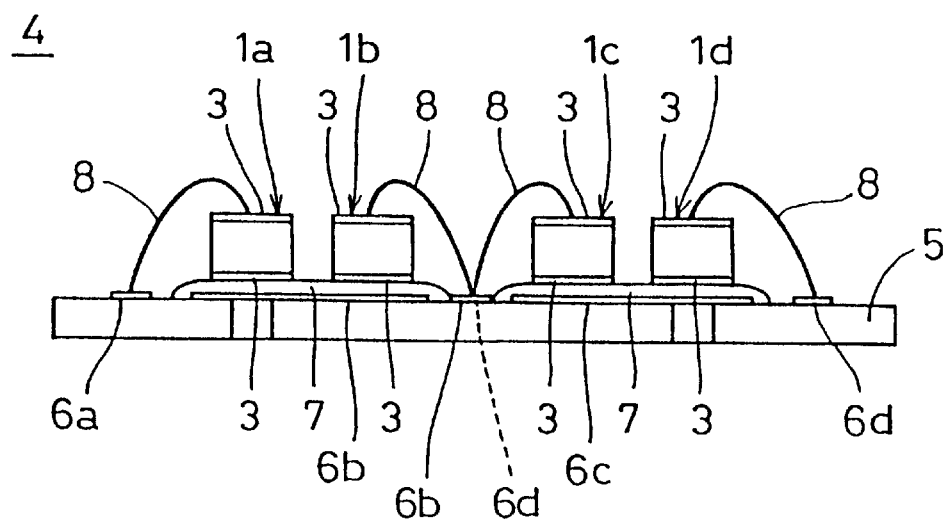
FIG. 28 is a front diagrammatic view of the ladder filter shown in FIG. 27.
Figure 29:
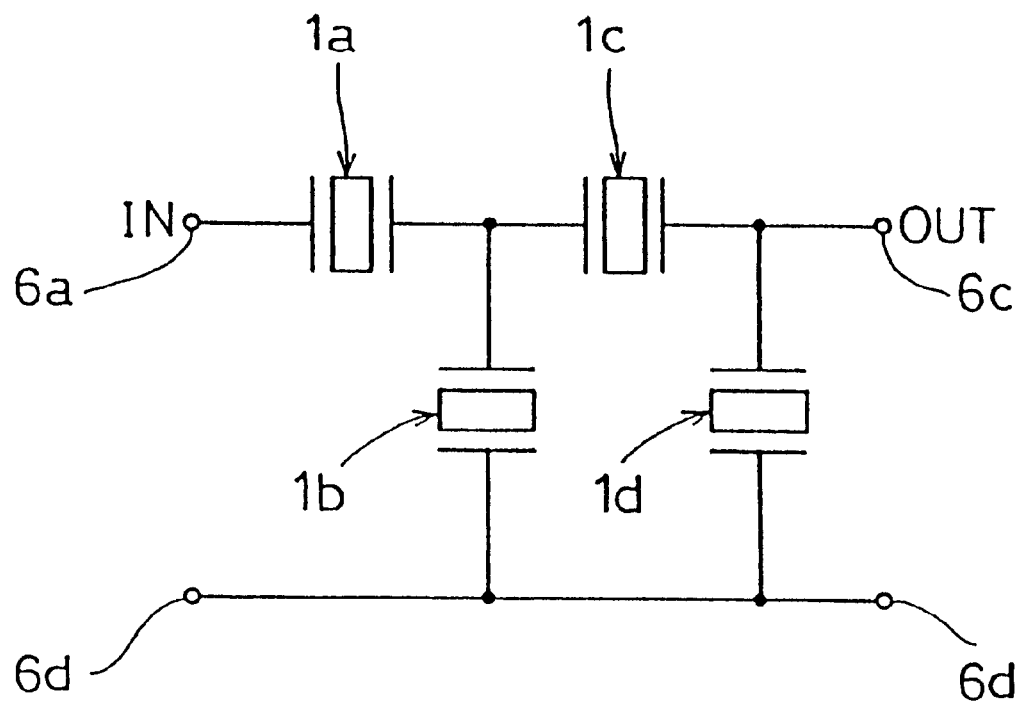
FIG. 29 is a circuit diagram of the ladder filter shown in FIG. 27.
Figure 30:
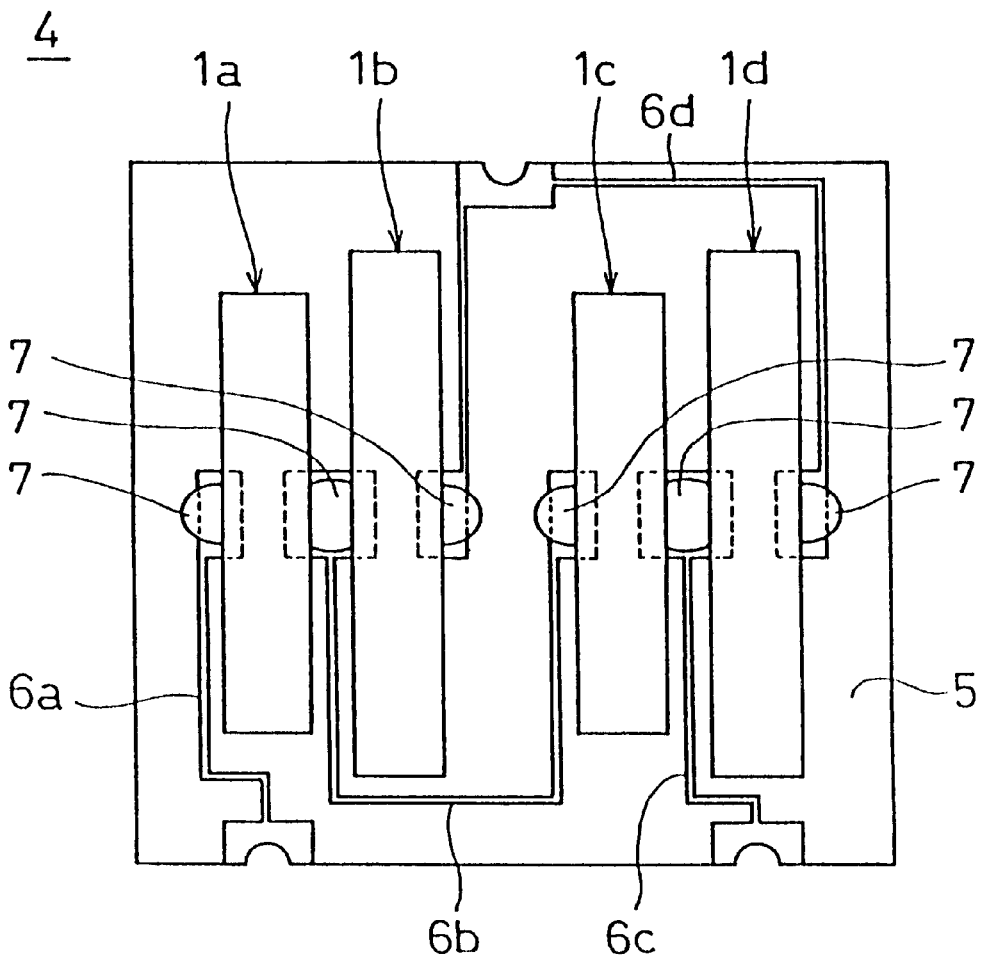
FIG. 30 is a plan diagrammatic view showing another example of a ladder filter which provides a background for comparison to preferred embodiments of the present invention.
Figure 31:
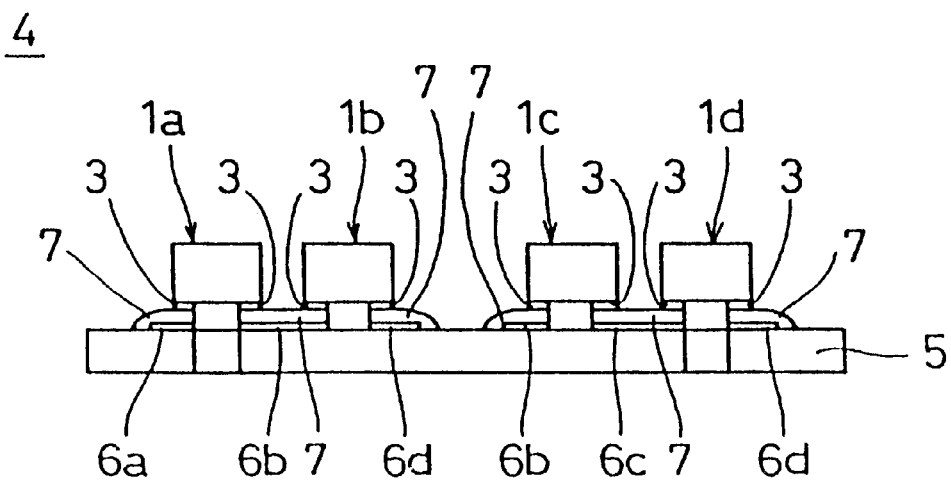
FIG. 31 is a front diagrammatic view of the ladder filter shown in FIG. 30.

Furthermore, in preferred embodiments of the present invention, the piezoelectric resonator shown in FIG. 26 may be used. In this case, the resonator is preferably arranged so that the side surface of the piezoelectric substrate of the piezoelectric resonator opposes one major surface of the insulator substrate 12.

Also, for the ladder filter according to preferred embodiments of the present invention, another surface-mountable piezoelectric resonator may be used.

Furthermore, in the ladder filter according to preferred embodiments of the present invention, the number of piezoelectric resonators to be used may be changed as desired.

This invention can be applied to another electronic component, such as a filter having a plurality of piezoelectric resonators, similar to a ladder filter.

In the present invention, the substrate is not limited to an insulation substrate, and may be a dielectric substrate provided with a capacitor or a multilayered substrate.

The electronic component element for use in the electronic component according to preferred embodiments of the present invention is not limited to a piezoelectric resonator.

There may be other electronic component elements, such as a capacitor, a resistor, and an inductor. Furthermore, the electronic component is not limited to a piezoelectric component, such as a ladder filter.

Figure 25:
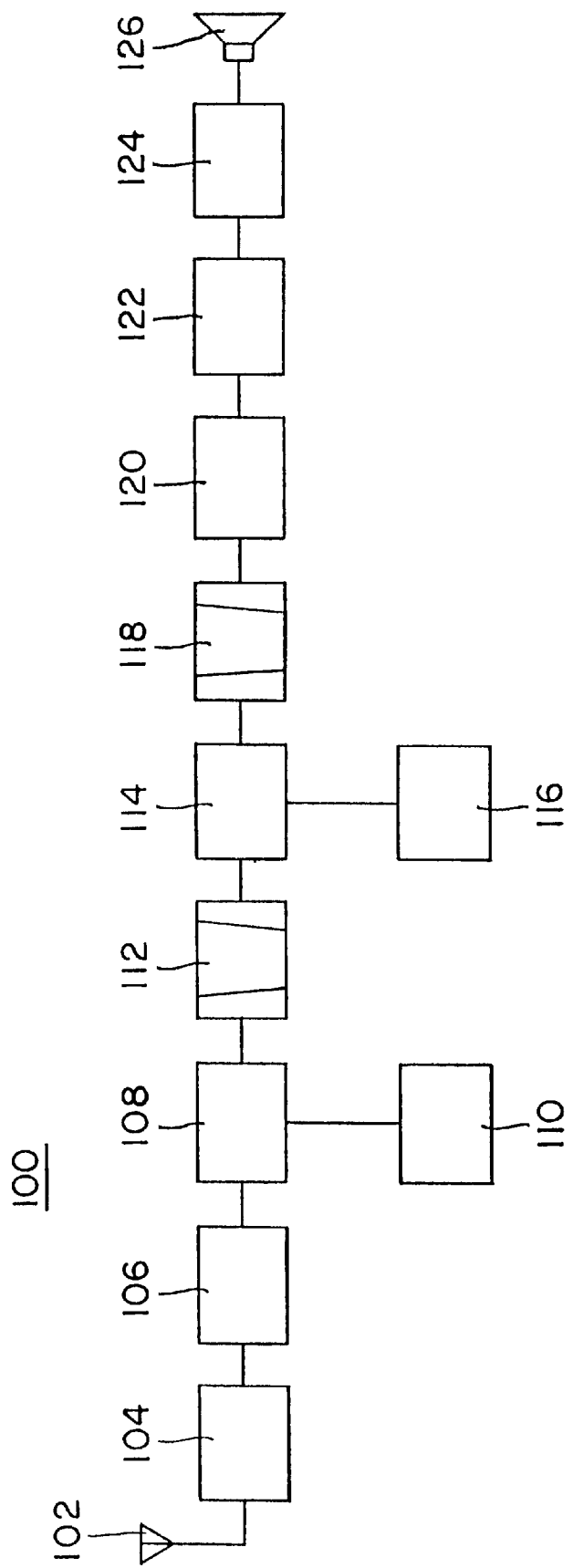
FIG. 25 is a block diagram showing one example of a double-super heterodyne receiver according to a preferred embodiment of the present invention.

FIG. 25 is a block diagram showing one preferred embodiment of a double-super-heterodyne receiver in accordance with the present invention. The super-heterodyne receiver 100 shown in FIG. 25 includes an antenna 102. The antenna 102 is connected to an input-end of an input-circuit 104. The input-circuit 104 performs an impedance matching between the antenna 102 and a high-frequency amplifier 106 which will be described below. A tuning circuit which selects a desired frequency or a band-pass filter is used as the input-circuit 104. An output-end of the input-circuit 104 is connected to an input-end of a high-frequency amplifier 106. The high-frequency amplifier 106 is used for improving a sensitivity by low-noise amplifying weak radio waves and for improving selectivity of image-frequencies. An output-end of the high-frequency amplifier 106 is connected to an input-end of a first frequency mixer 108. The first frequency mixer 108 is used for making a first integrated or differential intermediate-frequency by mixing a desired frequency and a first local oscillation frequency. The other input-end of the first frequency mixer 108 is connected to an output-end of a first local oscillator 110. The first local oscillator 110 is used for oscillating the first local oscillation frequency to generate the first intermediate-frequency. An output-end of the first frequency mixer 108 is connected to an input-end of a first band-pass filter 112. The first band-pass filter 112 is used for passing the first intermediate-frequency. An output-end of the first band-pass filter 112 is connected to one input-end of a second frequency mixer 114. The second frequency mixer 114 is used for making a second integrated or differential intermediate-frequency by mixing the first intermediate frequency and a second local oscillation frequency. The other input-end of the second frequency mixer 114 is connected to an output-end of a second local oscillator 116. The second local oscillator 116 is used for oscillating the second local oscillation frequency to generate the second intermediate-frequency. An output-end of the second frequency mixer 114 is connected to an input-end of a second band-pass filter 118. The second band-pass filter 118 is used for passing the second intermediate frequency. An output-end of the second band-pass filter 118 is connected to an input-end of an intermediate frequency amplifier 120. The intermediate frequency amplifier 120 is used for amplifying the second intermediate frequency. An output-end of the intermediate frequency amplifier 120 is connected to an input-end of a detector 122. The detector 122 is used for obtaining signal waves from the second intermediate frequency. An output-end of the second detector 122 is connected to an input-end of a low-frequency amplifier 124. The low-frequency amplifier 124 is used for amplifying the signal waves so that the signal waves can drive a speaker. An output-end of the low-frequency amplifier 124 is connected to a speaker 126.

In the present invention, the above described piezoelectric resonator can be used as the detector 122 in the double-super-heterodyne receiver 100. The above described ladder-filter can be used as each of the first band-pass filter 112 and the second band-pass filter 118. As a result, such a communication apparatus can have a significantly reduced size while also having excellent receiving characteristics.

In the present invention, the above-described piezoelectric resonator can be used as a detector in a single-super-heterodyne receiver. Further, the above-described ladder-filter can be used as a band-pass filter. Such single-super-heterodyne receiver can have a significantly reduced size while also having excellent receiving characteristics.

While the invention has been particularly shown and described with reference to preferred embodiments thereof, it will be understood by those skilled in the art that the forgoing and other changes in form and details may be made therein without departing from the spirit of the invention.

What is claimed is:

1. An electronic component, comprising:
    a substrate;
    a pattern electrode provided on said substrate and having a plurality of land portions;
    a plurality of electronic component elements provided on said substrate, each of said plurality of electronic component elements including a side surface having a longitudinal direction and two external electrodes provided on said side surface;
    said plurality of electronic component elements being arranged in order and electrically connected to each other in such a way that each adjacent pair of said plurality of electronic component elements are connected to each other via one of the land portions and the longitudinal directions of said electronic component elements are substantially aligned;
    at least one adjacent pair of said external electrodes, each of which adjacent external electrodes is provided on a different one of said electronic component elements disposed adjacent to each other, are connected to one of said land portions.

2. The electronic component according to claim 1, further comprising a conductive bonding member, wherein said at least one adjacent pair of said external electrodes are connected to said land via said conductive bonding member.

3. The electronic component according to claim 1, wherein each of said plurality of electronic component elements is a piezoelectric resonator adapted to vibrate a longitudinal vibration mode.

4. The electronic component according to claim 3, wherein each said piezoelectric resonator includes:
    a base having a longitudinal direction;
    a plurality of internal electrodes substantially perpendicular to the longitudinal direction of said base and spaced apart along the longitudinal direction of said base;
    said base comprising a plurality of multilayered piezoelectric layers;
    said plurality of piezoelectric layers being polarized along the longitudinal direction of said base;
    said plurality of internal electrodes being provided on a surface of said piezoelectric layers that is substantially perpendicular to the longitudinal direction of said base; and
    said two external electrodes are provided on the surface of said base and connected to said plurality of internal electrodes.

5. The electronic component according to claim 4, wherein for at least one of the piezoelectric resonators, a direction of polarization of the piezoelectric layers, a direction of an applied electric field applied by an input signal and a direction of vibration are the same.

6. The electronic component according to claim 4, wherein said base of each of the piezoelectric resonators includes a piezoelectrically active portion and a piezoelectrically inactive portion.

7. The electronic component according to claim 4, wherein adjacent ones of the piezoelectric layers in each of the piezoelectric resonators are polarized in opposite directions.

8. A ladder filter comprising:
    at least one electronic component including:
        a substrate;
        a pattern electrode provided on said substrate and having a land portion;
        a plurality of electronic component elements provided on said substrate, each of said plurality of electronic component elements including a side surface having a longitudinal direction and two external electrodes provided on said side surface;
        said plurality of electronic component elements being arranged in order and electrically connected to each other in such a way that each adjacent pair of said plurality of electronic component elements are connected to each other via one of the land portions and the longitudinal directions of said electronic component elements are substantially aligned;
        at least one adjacent pair of said external electrodes, each of which adjacent external electrodes is provided on a different one of said electronic component elements disposed adjacent to each other, are connected to one of said land portions.

9. The ladder filter according to claim 8, further comprising a conductive bonding member, wherein said at least one adjacent pair of said external electrodes are connected to said land via said conductive bonding member.

10. The ladder filter according to claim 8, wherein each of said plurality of electronic component elements is a piezoelectric resonator adapted to vibrate a longitudinal vibration mode.

11. The ladder filter according to claim 10, wherein each said piezoelectric resonator includes:
    a base having a longitudinal direction;
    a plurality of internal electrodes substantially perpendicular to the longitudinal direction of said base and spaced apart along the longitudinal direction of said base;
    said base comprising a plurality of multilayered piezoelectric layers;
    said plurality of piezoelectric layers being polarized along the longitudinal direction of said base;
    said plurality of internal electrodes being provided on a surface of said piezoelectric layers that is substantially perpendicular to the longitudinal direction of said base; and
    said two external electrodes are provided on the surface of said base and connected to said plurality of internal electrodes.

12. The ladder filter according to claim 11, wherein adjacent ones of the piezoelectric layers in each of the piezoelectric resonators are polarized in opposite directions.

13. The ladder filter according to claim 11, wherein said base of each of the piezoelectric resonators includes a piezoelectrically active portion and a piezoelectrically inactive portion.

14. The ladder filter according to claim 10, wherein for at least one of the piezoelectric resonators, a direction of polarization of the piezoelectric layers, a direction of an applied electric field applied by an input signal and a direction of vibration are the same.

15. The ladder filter according to claim 8, wherein said plurality of electronic component elements include a first parallel resonator, a second parallel resonator and a first series resonator.

16. The ladder filter according to claim 8, wherein said plurality of electronic component elements include a first parallel resonator, a second parallel resonator, a first series resonator and a second series resonator.

17. The ladder filter according to claim 16, wherein said piezoelectric resonators are arranged in an order of said first series resonator, said first parallel resonator, said second parallel resonator and said second series resonator.

18. The ladder filter according to claim 16, wherein said piezoelectric resonators are arranged in an order of said first series resonator, said second series resonator, said second parallel resonator and said first parallel resonator.

19. The ladder filter according to claim 8, wherein said plurality of electronic component elements include a first parallel resonator, a second parallel resonator, a third parallel resonator, a first series resonator and a second series resonator.

20. A communication apparatus having a band-pass filter, wherein the band pass filter includes a ladder filter according to claim 8.

\* \* \* \* \*